US011276676B2

(12) United States Patent
Enquist et al.

(10) Patent No.: US 11,276,676 B2
(45) Date of Patent: Mar. 15, 2022

(54) STACKED DEVICES AND METHODS OF FABRICATION

(71) Applicant: Invensas Bonding Technologies, Inc., San Jose, CA (US)

(72) Inventors: Paul M. Enquist, Durham, NC (US); Belgacem Haba, Saratoga, CA (US)

(73) Assignee: INVENSAS BONDING TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/413,429

(22) Filed: May 15, 2019

(65) Prior Publication Data
US 2019/0355706 A1    Nov. 21, 2019

Related U.S. Application Data

(60) Provisional application No. 62/671,917, filed on May 15, 2018.

(51) Int. Cl.
*H01L 25/00* (2006.01)
*H01L 25/18* (2006.01)
(Continued)

(52) U.S. Cl.
CPC ........ *H01L 25/50* (2013.01); *H01L 21/76898* (2013.01); *H01L 21/8221* (2013.01);
(Continued)

(58) Field of Classification Search
CPC ............... H01L 25/043; H01L 25/0652; H01L 25/0657; H01L 25/071; H01L 25/074;
(Continued)

(56) References Cited

U.S. PATENT DOCUMENTS

| 5,753,536 A | 5/1998 | Sugiyama et al. |
| 5,771,555 A | 6/1998 | Eda et al. |

(Continued)

FOREIGN PATENT DOCUMENTS

| JP | 2002-353416 A | 6/2002 |
| JP | 2013-33786 A | 2/2013 |

(Continued)

OTHER PUBLICATIONS

Ker, Ming-Dou et al., "Fully Process-Compatible Layout Design on Bond Pad to Improve Wire Bond Reliability in CMOS ICs," IEEE Transactions on Components and Packaging Technologies, Jun. 2002, vol. 25, No. 2, pp. 309-316.

(Continued)

*Primary Examiner* — Scott B Geyer
(74) *Attorney, Agent, or Firm* — Lee & Hayes, P.C.

(57) ABSTRACT

Stacked devices and methods of fabrication are provided. Die-to-wafer (D2W) direct-bonding techniques join layers of dies of various physical sizes, form factors, and foundry nodes to a semiconductor wafer, to interposers, or to boards and panels, allowing mixing and matching of variegated dies in the fabrication of 3D stacked devices during wafer level packaging (WLP). Molding material fills in lateral spaces between dies to enable fan-out versions of 3D die stacks with fine pitch leads and capability of vertical through-vias throughout. Molding material is planarized to create direct-bonding surfaces between multiple layers of the variegated dies for high interconnect density and reduction of vertical height. Interposers with variegated dies on one or both sides can be created and bonded to wafers. Logic dies and image sensors from different fabrication nodes and different wafer sizes can be stacked during WLP, or logic dies and high bandwidth memory (HBM) of different geometries can be stacked during WLP.

15 Claims, 13 Drawing Sheets

(51) Int. Cl.
- *H01L 27/146* (2006.01)
- *H01L 21/822* (2006.01)
- *H01L 23/31* (2006.01)
- *H01L 21/768* (2006.01)
- *H01L 23/48* (2006.01)
- *H01L 23/00* (2006.01)
- *H01L 25/07* (2006.01)

(52) U.S. Cl.
CPC ........ *H01L 23/3171* (2013.01); *H01L 23/481* (2013.01); *H01L 24/09* (2013.01); *H01L 25/074* (2013.01); *H01L 25/18* (2013.01); *H01L 27/1469* (2013.01); *H01L 27/14618* (2013.01); *H01L 27/14621* (2013.01); *H01L 27/14627* (2013.01); *H01L 27/14632* (2013.01); *H01L 27/14634* (2013.01); *H01L 27/14636* (2013.01); *H01L 27/14687* (2013.01); *H01L 2224/02379* (2013.01); *H01L 2924/1431* (2013.01); *H01L 2924/1434* (2013.01)

(58) Field of Classification Search
CPC ....... H01L 25/076; H01L 25/18; H01L 25/50; H01L 2225/06541; H01L 2225/06544; H01L 2225/06555; H01L 2225/06568; H01L 23/3157; H01L 23/3171; H01L 23/3185; H01L 21/56; H01L 21/561; H01L 2924/181; H01L 2924/1811; H01L 2924/1815; H01L 2924/1816; H01L 2924/18162; H01L 2924/1812
See application file for complete search history.

(56) References Cited

U.S. PATENT DOCUMENTS

| | | |
|---|---|---|
| 6,080,640 A | 6/2000 | Gardner et al. |
| 6,423,640 B1 | 7/2002 | Lee et al. |
| 6,465,892 B1 | 10/2002 | Suga |
| 6,887,769 B2 | 5/2005 | Kellar et al. |
| 6,908,027 B2 | 6/2005 | Tolchinsky et al. |
| 7,045,453 B2 | 5/2006 | Canaperi et al. |
| 7,105,980 B2 | 9/2006 | Abbott et al. |
| 7,193,423 B1 | 3/2007 | Dalton et al. |
| 7,750,488 B2 | 7/2010 | Patti et al. |
| 7,803,693 B2 | 9/2010 | Trezza |
| 7,843,052 B1* | 11/2010 | Yoo ..................... H01L 23/3114 257/686 |
| 7,932,616 B2* | 4/2011 | Meguro ................. H01L 24/85 257/786 |
| 8,183,127 B2 | 5/2012 | Patti et al. |
| 8,349,635 B1 | 1/2013 | Gan et al. |
| 8,377,798 B2 | 2/2013 | Peng et al. |
| 8,441,131 B2 | 5/2013 | Ryan |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,802,538 B1 | 8/2014 | Liu |
| 8,809,123 B2 | 8/2014 | Liu et al. |
| 9,142,517 B2 | 9/2015 | Liu |
| 9,171,756 B2 | 10/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,337,235 B2 | 5/2016 | Chen et al. |
| 9,394,161 B2 | 7/2016 | Cheng et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,496,239 B1 | 11/2016 | Edelstein et al. |
| 9,536,848 B2 | 1/2017 | England et al. |
| 9,559,081 B1* | 1/2017 | Lai ..................... H01L 23/5385 |
| 9,620,481 B2 | 4/2017 | Edelstein et al. |
| 9,656,852 B2 | 5/2017 | Cheng et al. |
| 9,723,716 B2 | 8/2017 | Meinhold |
| 9,728,521 B2 | 8/2017 | Tsai et al. |
| 9,799,587 B2 | 10/2017 | Fujii et al. |
| 9,818,729 B1* | 11/2017 | Chiu ..................... H01L 21/78 |
| 9,893,004 B2 | 2/2018 | Yazdani |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,026,605 B2 | 7/2018 | Doub et al. |
| 10,075,657 B2 | 9/2018 | Fahim et al. |
| 10,269,756 B2 | 4/2019 | Uzoh |
| 10,276,619 B2 | 4/2019 | Kao et al. |
| 2002/0003307 A1 | 1/2002 | Suga |
| 2004/0084414 A1 | 5/2004 | Sakai et al. |
| 2006/0057945 A1 | 3/2006 | Hsu et al. |
| 2007/0111386 A1 | 5/2007 | Kim et al. |
| 2011/0186977 A1* | 8/2011 | Chi ..................... H01L 24/97 257/686 |
| 2012/0049344 A1* | 3/2012 | Pagaila ............... H01L 25/0657 257/737 |
| 2012/0217644 A1* | 8/2012 | Pagaila ................ H01L 21/568 257/774 |
| 2012/0282735 A1* | 11/2012 | Ahn ..................... H01L 21/6835 438/109 |
| 2012/0292745 A1* | 11/2012 | Park ..................... H01L 25/0652 257/621 |
| 2013/0082399 A1* | 4/2013 | Kim ..................... H01L 24/81 257/774 |
| 2013/0334697 A1* | 12/2013 | Shin ..................... H01L 25/105 257/774 |
| 2014/0084456 A1* | 3/2014 | Kang ..................... H01L 21/563 257/737 |
| 2014/0175655 A1 | 6/2014 | Chen et al. |
| 2014/0213017 A1* | 7/2014 | Kim ..................... H01L 21/82 438/107 |
| 2014/0295618 A1* | 10/2014 | Kim ..................... H01L 24/97 438/108 |
| 2014/0327150 A1* | 11/2014 | Jung ..................... H01L 23/291 257/774 |
| 2014/0377909 A1* | 12/2014 | Chung ..................... H01L 24/97 438/113 |
| 2015/0048500 A1* | 2/2015 | Yu ..................... H01L 25/18 257/737 |
| 2015/0048519 A1* | 2/2015 | Park ..................... H01L 24/13 257/774 |
| 2015/0064498 A1 | 3/2015 | Tong |
| 2015/0130082 A1* | 5/2015 | Lu ..................... H01L 24/16 257/777 |
| 2015/0206865 A1* | 7/2015 | Yu ..................... H01L 24/17 257/737 |
| 2015/0270209 A1* | 9/2015 | Woychik ................. H01L 24/94 257/774 |
| 2015/0303174 A1* | 10/2015 | Yu ..................... H01L 21/6835 257/712 |
| 2016/0343682 A1 | 11/2016 | Kawasaki |
| 2017/0023405 A1* | 1/2017 | Fahim ................ G01R 31/2851 |
| 2018/0005992 A1* | 1/2018 | Yu ..................... H01L 25/50 |
| 2018/0006006 A1* | 1/2018 | Kim ..................... H01L 24/94 |
| 2018/0012863 A1* | 1/2018 | Yu ..................... H01L 21/6835 |
| 2018/0053746 A1* | 2/2018 | Yu ..................... H01L 24/97 |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0219038 A1 | 8/2018 | Gambino et al. |
| 2018/0323177 A1 | 11/2018 | Yu et al. |
| 2018/0323227 A1 | 11/2018 | Zhang et al. |

(56) References Cited

U.S. PATENT DOCUMENTS

2018/0331066 A1   11/2018  Uzoh et al.
2019/0115277 A1    4/2019  Yu et al.
2019/0131277 A1    5/2019  Yang et al.

FOREIGN PATENT DOCUMENTS

JP      2018-160519 A   10/2018
WO    2005-043584 A2    5/2005

OTHER PUBLICATIONS

Moriceau, H. et al., "Overview of Recent Direct Wafer Bonding Advances and Applications", Advances in Natural Sciences—Nanoscience and Nanotechnology, 2010, 12 pages.
Nakanishi, H. et al., "Studies on SiO2-SiO2 Bonding with Hydrofluoric Acid. Room Temperature and Low Stress Bonding Technique for MEMS," Tech. Research Lab., 200, Elsevier Science S.A., 8 pages.
Oberhammer et al., "Sealing of Adhesive Bonded Devices on Wafer Level," in Sensors and Actuators A, vol. 110, No. 1-3, pp. 407-412, Feb. 29, 2004, see pp. 407-412; and figures 1(a)-1(I), 6 pages.
Plobi et al., "Wafer Direct Bonding: Tailoring Adhesion Between Brittle Materials," Materials Science and Engineering Review Journal, 1999, 88 pages.
Suga et al., "Bump-less Interconnect for Next Generation System Packaging," IEEE (2001) and ECTC 2001, 6 pages.
WO2020028080 Search Report and Written Opinion, dated Jul. 2019, 9 pages.

\* cited by examiner

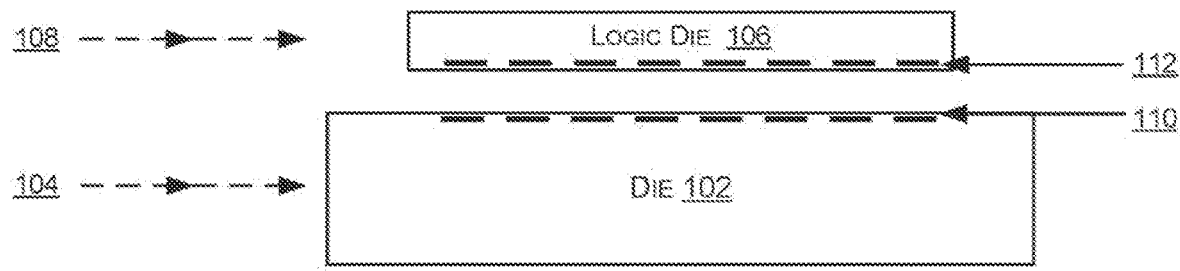
FIG. 1A
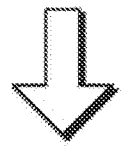
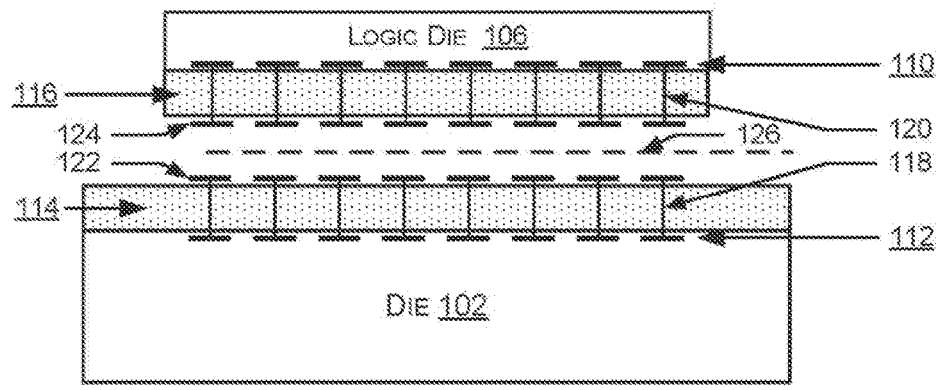
FIG. 1B
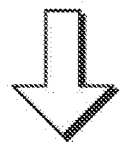

STACKED DEVICES AND METHODS OF FABRICATION

RELATED APPLICATIONS

This patent application claims the benefit of priority to U.S. Provisional Patent Application No. 62/671,917 to Enquist et al., filed May 15, 2018 and incorporated by reference herein, in its entirety.

BACKGROUND

Conventional microelectronic packaging technologies dice wafers into individual integrated circuit microchips ("dies") and then package the dies, or arrange the dies onto horizontal substrates and into vertical stacks that make up microelectronics packages, such as 3-dimensional ICs ("3DICs). Separately, the fabrication processes that form the IC dies on semiconductor wafers in the first place use fabrication technologies in foundry environments that differ from the packaging environments and associated packaging techniques used in micropackaging houses. Micropackage design is a somewhat different science than wafer fabrication design, each using respective processes and materials. Conventional wafer level packaging (WLP) creates some packaging of the dies while still on the wafer, before dicing into individual micropackages, while conventional fan-out wafer level packaging (FOWLP) places a layer of known-good-dies on a carrier wafer or panel and creates a fan-out area around the dies with molding material. A redistribution layer then fans the leads of the dies out onto the larger footprint of the molding material around the dies in the single layer, and may array connective solder balls on the larger footprint.

Both fabrication of dies and micropackaging of the fabricated dies into 3DICs and interposers seek to be more efficient and cost effective, while providing more electronic circuits and more computing power in smaller and smaller packages. Constructing a microelectronics package can adopt novel structures not constrained by the usual planarity of semiconductor fabrication on horizontal surfaces of wafers. Thus, micropackaging often uses a wider variety of materials in the construction of 3DICs and interposers, such as plastic encapsulants, polymers, and structural substrate materials that are not limited to silicon and other semiconductors. Despite their common theme of making and using IC dies, the practices of conventional semiconductor fabrication and conventional microelectronics packaging are traditionally distinct and separate, albeit related, technologies.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

FIGS. 1A and 1B are diagrams showing the start of a process for direct-bonding dies of a first footprint size to dies of a second footprint size in a wafer level process.

DETAILED DESCRIPTION

Overview

Figure 2A:
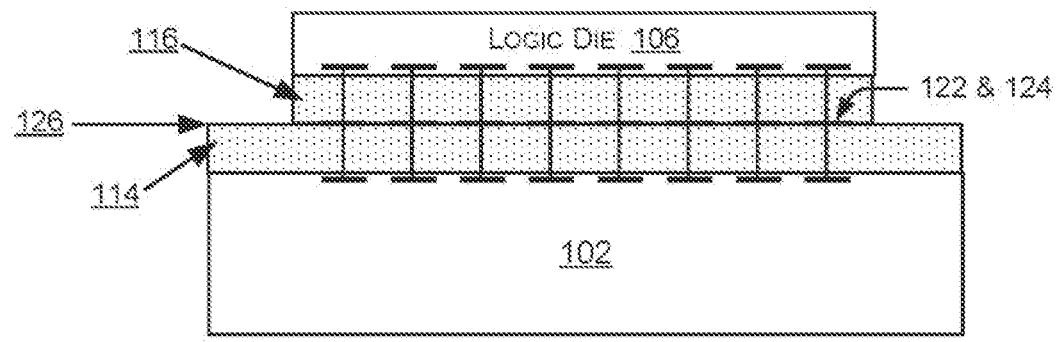
FIGS. 2A-2C are diagrams showing a continuation of the process of FIGS. 1A and 1B, for direct-bonding dies of a first footprint size to dies of a second footprint size in a wafer level process.

This disclosure describes stacked devices and associated methods of fabrication. Systems and methods described herein enable die-to-wafer (D2W) or chip-to-wafer (C2W) techniques to bond layers of dies of various physical sizes, form factors, and foundry nodes (process nodes, technology nodes) to a semiconductor wafer, to interposers, or to boards and panels (all of these may be referred to herein as "substrates"). The example systems and methods enable 3D stacking of variegated dies by direct hybrid bonding within a wafer level packaging (WLP) flow, including fan-out versions of 3D die stacks consisting of dies with different footprints—at the level of wafer level packaging. The systems and methods enable direct-bonding of layers of variegated dies mixed and matched from various different foundry nodes (process nodes, technology nodes), different form factors, different wafer sizes, and different package physical sizes into vertical stacks within a single micropackage at wafer level, with the benefits of high interconnect density and space-saving provided by the direct hybrid bonding. If the micropackage is an interposer, the interposer can have the variegated dies on one or both sides, including dies of different geometries stacked vertically on one or both sides. Interposers bearing multiple types of dies of various physical sizes and foundry nodes, including stacks of such dies, can then be bonded to a semiconductor wafer, in one example scenario.

Conventional wafer-to-wafer bonding usually implies that chip dimensions are identical for the vertical wafer layers being bonded, but the yield decreases dramatically with the number of layers because individually defective dies on the wafers being stacked make an entire individual vertical stack defective. The example systems and methods described herein allow mixing and matching of variegated dies from different wafer sizes and different foundry technologies to be picked and placed on a substrate (such as a wafer), and further allows these variegated dies of different physical dimensions to form stacked layers, all through direct-bonding techniques that provide high-density signal connections and smaller packages.

These example systems and methods enable creation of micropackage architecture in which conventionally incompatible dies picked from wafers that differ from each other in technology, foundry node, wafer size, and form factor can be bonded together in the same micropackage at wafer level without much restriction, given a common interconnect interface between any two units being direct-bonded together. The example systems and methods also provide the advantage of high yield production, since variegated dies selected from different sources for direct-bonding and stacking to a wafer or interposer can be known-good-dies (KGDs).

A foundry node ("technology node," "process node," "process technology," or simply "node") refers to a specific semiconductor manufacturing process and its design rules, and generally refers to a minimum feature size. Different nodes imply different architectures and circuits from different generations of the technology. Essentially, technology node refers to the physical size of the transistor being fabricated. The more recent the technology node, the smaller the transistors, with more transistors per unit area, which in turn provides faster switching, less energy use, and cooler operation than a previous version of the same technology node. Thus, smaller technology nodes generally have smaller feature sizes: smaller transistors that are faster and more power-efficient than those made according to an earlier node.

Silicon wafer diameter nodes, a different designation than foundry nodes, have progressed in the other direction, from smaller to larger. Recent silicon wafer diameter nodes are 150 mm, 200 mm, and 300 mm, with 450 mm on the horizon. Larger semiconductor wafers reduce the manufacturing cost per transistor by raising the integration level through device scaling and other factors such as improvement in production yield because of non-defect rate, and increased throughput in production volume per unit of time. As the area of wafer surface increases, the number of semiconductor dies obtainable from a wafer also increases, reducing the production cost per die. Larger, more recent wafer sizes tend to incorporate the latest technology nodes (smaller feature sizes). Between different possible semiconductor wafer size nodes, and different foundry nodes ("technology nodes" or "process nodes"), the physical sizes and electronic feature sizes of the resulting dies can vary greatly. These different dies from different size semiconductor wafers and made according to different foundry nodes are referred to herein as "variegated dies," that is, dies of different physical dimensions and different feature and technology sizes.

In an implementation, an example process described herein direct-bonds the variegated dies of various physical sizes, form factors, and/or foundry nodes to wafers of same or different size origin or foundry node, filling in lateral spaces caused by differences in physical sizes and form factors with a molding material to fill and complete a given horizontal bonding layer. This can be accomplished at wafer level. The molding material may be a molding compound, a resist material, a glass, a silicon spacer material, or a thermally conductive compound. The interstitial molding material may be extremely thin vertically, matching the layer's vertical thickness determined by the heights of the dies being direct-bonded in that layer. The particular bonding layer of dies and molding may then be planarized with chemical-mechanical planarization (CMP) or other polishing technique at wafer level to prepare for a next bonding layer of variegated dies from various foundry nodes and wafer sizes to be direct-bonded to the previous layer. The example process allows continued stacking of the variegated dies and interstitial molding within each bonding layer, to make vertical stacks of the variegated dies in a microelectronics package.

Conductive through-vias, interconnects, and/or leads can be disposed in the molding material disposed laterally between the variegated dies of a given direct-bonding layer of dies. This allows horizontal fan-out of the leads of dies of a given layer, and also allows vertical transmission of signals between adjacent layers of dies, or through multiple layers of dies, without necessarily having to create any vias through the dies themselves.

The coefficient of thermal expansion (CTE) of the molding material used in the example systems and methods aims to match the CTE of silicon or other semiconductor substrate material in use. This match of the CTEs between semiconductor and molding makes the molding material amenable to expansion and contraction of the semiconductor material caused by thermal fluctuations during further steps of the fabrication process, and also amenable to thermal fluctuations during operation of the micropackage when in use as a "chip" in an end device. Likewise, the hardness, density, friability, and other physical characteristics of the molding material is ideally formulated to match those of silicon or other semiconductor, so that CMP and other polishing and finishing processes cannot distinguish between the molding material and the semiconductor, for purposes of polishing to a flat or ultra-flat surface that is free from significant dishing and rounding: and so immediately available for further direct-bonding steps in construction of vertical stacks of the variegated dies.

In an implementation, since "direct-bonding" is the only bonding process used between dies, between dies and wafer, and between dies and interposer, then intervening connection structures such as ball grid arrays may be eliminated to save space. In an implementation, direct-bonding between dies, or between dies and wafer, can be between native interconnects of the logic circuits and other native circuits of the dies and wafers. This use of native interconnects direct-bonded together can save even more space, since in some cases standard interfaces may be eliminated during design of the variegated dies themselves.

Suitable direct-bonding techniques prepare surfaces for molecule-to-molecule, covalent, ionic, and/or metallic bonding between like materials on each side of the direct-bonding interface. For example, freshly prepared flat surfaces of copper metal (Cu) may bond to each other upon contact with or without pressure and heat, forming copper diffusion bonds, metal-to-metal bonds, and the like. Zibond® brand direct-bonding is one example direct-bonding technique for dielectrics, oxide materials, and other nonmetals (Xperi Corporation, San Jose, Calif.). Zibond® direct-bonding is a room temperature wafer-to-wafer or die-to-wafer direct-bonding technique. DBI® brand hybrid bonding, is an example direct-bonding technique for joining nonmetal (e.g., dielectric) surfaces that also have metal interconnects to be joined together in the same planar bonding interface (Xperi Corporation, San Jose, Calif.). The DBI direct hybrid bonding may be accomplished in one operation, in which oxide dielectric surfaces direct-bond together first, at room temperature, and then metal interconnects on each side of the bonding plane direct-bond together during an annealing phase at slightly or moderately elevated temperatures.

The molding material introduced above, when used as a filler or plastic encapsulant, is conventionally found in micropackaging technologies, and is also used for making reconstituted wafers having a layer of chips or dies diced from a first wafer, and then joined to a second carrier wafer or panel in a single layer on the wafer or panel. In micropackaging, such molding materials and various fillers may be put to use in layers of a few mils (a mil is one-thousandth of an inch or 0.001 inch), and up to far greater thicknesses in construction of a 3DIC.

The molding material suitable for the example systems and processes described herein is applied to fill-in lateral spaces between dies but in much thinner vertical layers than used for reconstituting wafers, at a vertical height suitable for the dies in the layer being direct-bonded to a previous layer. This molding material may be only a few microns thick (25.4 microns=1 mil), depending on the dimensions and form factor of the dies being direct-bonded to wafers and to other dies. The molding material is recruited to the wafer fabrication environment to make ultra-flat surfaces for direct hybrid bonding between layers of variegated dies. Whereas a conventional process for making a reconstituted wafer is limited to using the molding material as an encapsulant, the example processes herein are able to use the molding material to make surfaces suitable for direct-bonding stacks of variegated dies within the scope of the wafer level semiconductor fabrication process itself.

Example systems and methods are not limited to front-to-front direct hybrid bonding of dies to wafers, and front-to-front direct hybrid bonding of dies to other dies. Although front-to-front examples of stacked structures may be shown and described representatively herein, the direct bonding of dies to wafers or dies to dies according to the example system and methods described herein may be front-to-front, front-to-back, or back-to-back, when these possible configurations are desired in a given scenario. The use of handle wafers with intermediate temporary bond and debond steps may be used to present a back surface for bonding.

Example Stacked Structures

In FIGS. 1A and 1B and in all the figures described herein, the layers illustrated are not shown to relative scale. For example, layers of dielectric material and silicon that provide bonding layers and direct-bonding surfaces are shown with exaggerated thickness for the sake of illustration and description, and to emphasize their presence and their various features. Some of these layers of materials may be extremely thin layers, coatings, or deposits in actual microelectronic devices.

In FIGS. 1A and 1B and all the figures described herein, the various dies may be shown as direct-bonded to each other face-to-face, with direct hybrid bonding of both dielectric surfaces and metal interconnects between the dies at the bonding interfaces but the stacked structures shown and the related processes are not limited to face-to-face direct bonding of the dies. The dies on adjacent vertical layers of the example stacked structures may also be direct-bonded face-to-back and back-to-back in addition to the face-to-face direct bonding of the dies in the layers of the stacked structures.

FIG. 1A shows the start of an example process for making a microelectronic device using a wafer level process, including D2W techniques. A substrate, such as a wafer, has first dies 102 in a first layer 104, and at least some of the first dies 102 have a first footprint size and specific physical dimensions. Second dies 106 in a second layer 108 include dies with a second footprint size and/or different physical dimensions than the footprint size and physical dimensions of the first dies 102 in the first layer 104.

Dies 102 in the first layer 104 have a front side layer of metal contacts 110 providing electrical contacts and/or redistribution traces for integrated circuits of the dies 102. The metal contacts 110 can be built up into a bonding layer with interconnects for direct-bonding to the second dies 106, or in some cases the metal contacts 110 can be bonded directly to the second dies 106 without further buildup of redistribution layers RDLs or further vertical extension using through-vias.

Likewise, the second dies 106 residing in the second layer 108 have a respective layer of metal 112 for making electrical contacts that can be built up through RDLs or by vertical extension by through-vias, or in some cases direct-bonded directly to the first dies 102.

Turning to FIG. 1B, in one implementation, dielectric (or silicon) layers 114 and 116 are added to respective dies 102 and 106 to make direct hybrid bonding surfaces. In the through-vias (e.g., 118 and 120) or other interconnects or redistribution conductors rise vertically through the dielectric layers 114 and 116 to metal bonding pads 122 and 124 on the surfaces of the respective dies 102 and 106 for eventual direct-bonding at a bonding interface 126.

In FIG. 2A, continuing the example process, the dielectric layers 114 and 116 and the respective metal bonding pads 122 and 124 all participate in direct hybrid bonding at the bonding interface 126. The two respective dielectric layers 114 and 116 direct-bond to each other in dielectric-to-dielectric direct bonding, while the metal bonding pads 122 and 124 direct-bond to each other in metal-to-metal direct bonding, during an annealing phase of the same direct hybrid bonding operation, for example.

The first dies 102 of the wafer, or on a substrate, may be memory dies, sensor image dies, or other kinds of dies of various types and sizes. The second dies 106, with different physical dimensions and/or different footprints than the first dies 102, may be logic dies or other dies to be communicatively coupled with the first dies 102. Thus, the first dies 102 and the second dies 106 may be mixed and matched from different wafer sizes, different foundry nodes (process nodes, technology nodes), different footprints, different functionalities, different physical sizes, and so forth, referred to hereinafter as variegated dies.

Figure 2B:
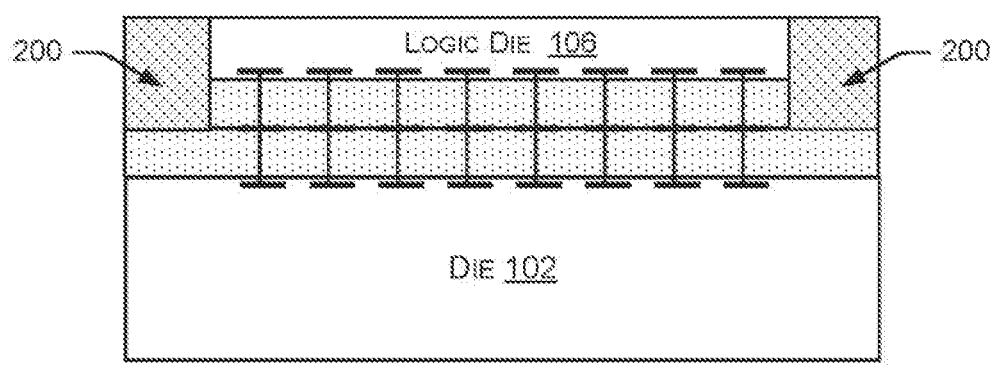

Turning to FIG. 2B, in a next step, a molding material 200 is applied to at least partially fill-in spaces that occur horizontally between the second dies 106 in the second layer 108. The molding material 200 ideally has a similar (CTE) as the dies 106 or dielectric 116 (or silicon) that the molding material 200 is intervening between. The molding material may be a compound such as a filler material, a resist compound, silicon, a high thermal conductivity compound, formed diamond, deposited diamond, formed aluminum nitride, deposited aluminum nitride, a material with a CTE close to a CTE of silicon, a packaging material, or a board material, for example.

Figure 2C:
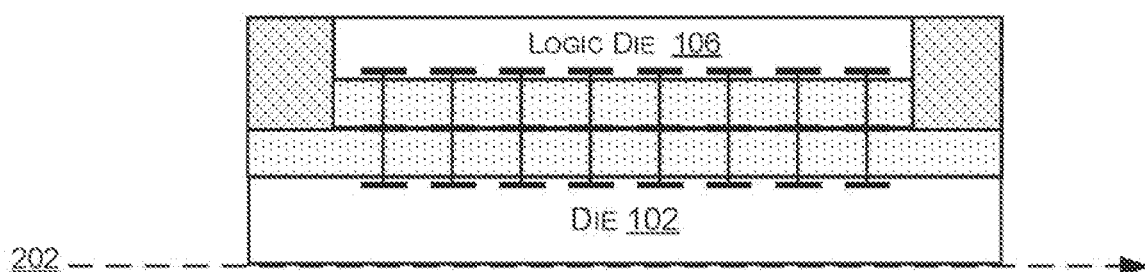

At this point in the example process and turning to FIG. 2C, the wafer or substrate on which the first dies 102 reside may be thinned 202, especially if the second layer of dies 106 is the only layer to be direct-bonded to the layer of first dies 102.

FIGS. 3A-3D show various ways in which first dies 102 of a wafer, carrier, or substrate that have been direct-bonded to seconds dies 106 of different size, footprint, wafer-origin, and/or foundry node can be interconnected externally, outside their own micropackage.

Figure 3A:
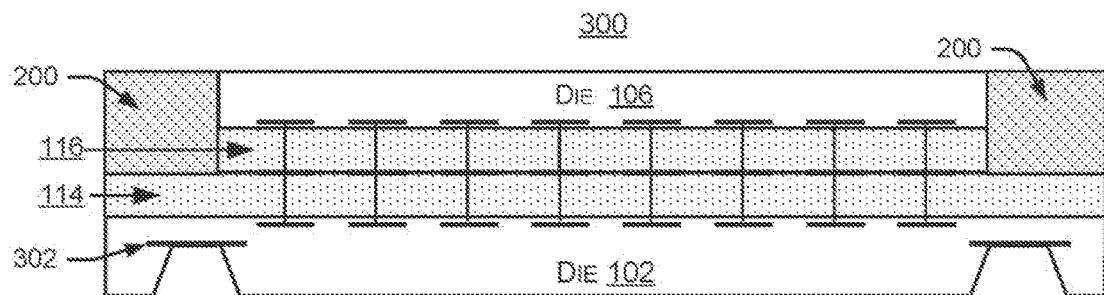
FIGS. 3A-3D are diagrams of example devices showing routing and interconnect variations in devices made by direct-bonding dies of a first footprint size to dies of a second footprint size in a wafer level process.

In example micropackage 300, as depicted in FIG. 3A, a metallization layer 302 of the first dies 102 has pad areas available that can be etched out of each die 102 (or wafer or substrate) to make electrical contacts, either for external connection or for continuance of the fabrication of the micropackage 300.

Figure 3B:
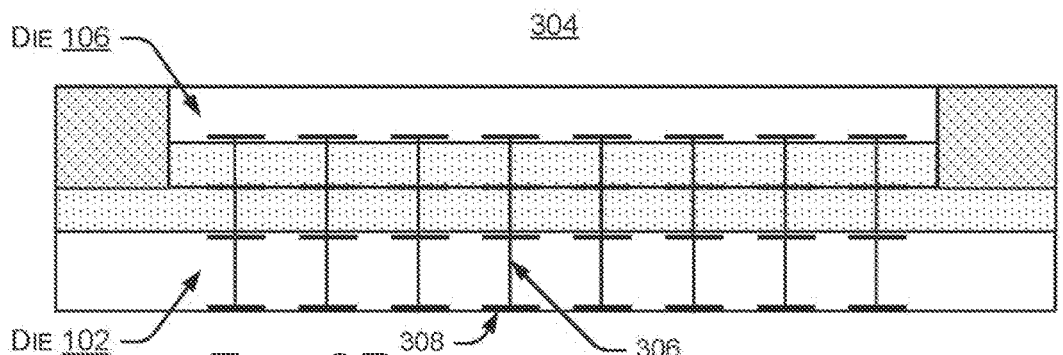

In example micropackage 304, as depicted in FIG. 3B, through silicon vias (TSVs) 306 are made through the first dies 102 to enable backside electrical connection at backside contact pads 308, for example, and/or construction of RDLs on the backside of the dies 102 or thinned wafer hosting the dies 102.

Figure 3C:
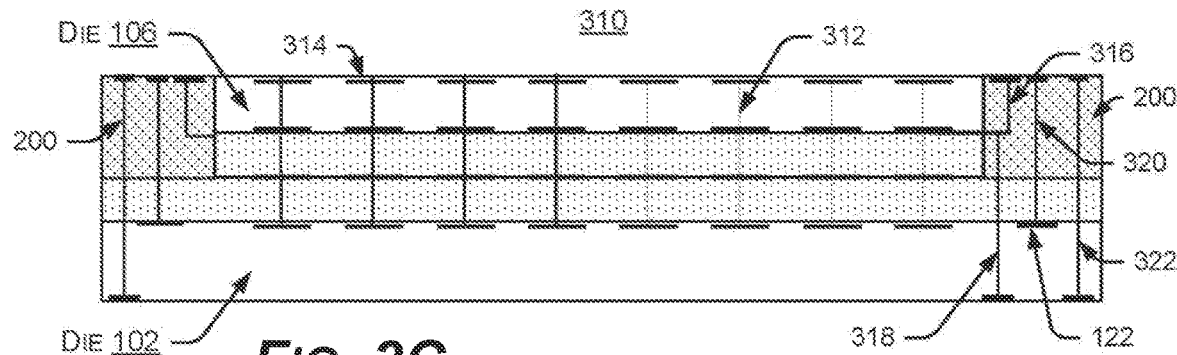

In example micropackage 310, as depicted in FIG. 3C, TSVs 312 are made through the second dies 106 to enable electrical connection at backside contact pads 314 of the second dies 106, for example, and/or to connect with RDLs to be fabricated on the backsides of the second dies 106.

Through-vias 316 may also be constructed to pass through the molding material 200 that has been applied to at least partially fill the spaces between dies 106 of a given direct-bonded layer. Such through vias 316 and 318 through the molding material 200 can extend to either side of the entire micropackage 310. Through-vias 320 can also extend from the contact pads 122 of the first dies 102, through the molding material 200, to the backside of the second dies 106 or beyond (if there are additional direct-bonded layers of dies). Similarly, through-vias 322 can extend all the way through the entire example micropackage 310, including through the molding material 200, from one side of the example micropackage 310 to the other.

Figure 3D:
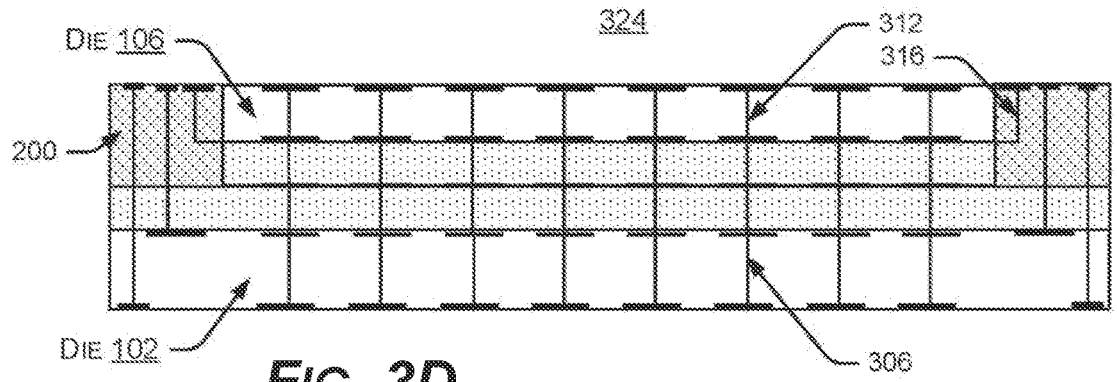

In example micropackage 324, as depicted in FIG. 3D, various TSVs 306 and 312 and various through-vias 316 extending through the molding material 200 can extend from the contact pads of dies 102 and 106 from multiple layers of the micropackage 324, to both front and back sides of the microelectronics package 324, traversing through the molding material 200 as needed.

Figure 4A:
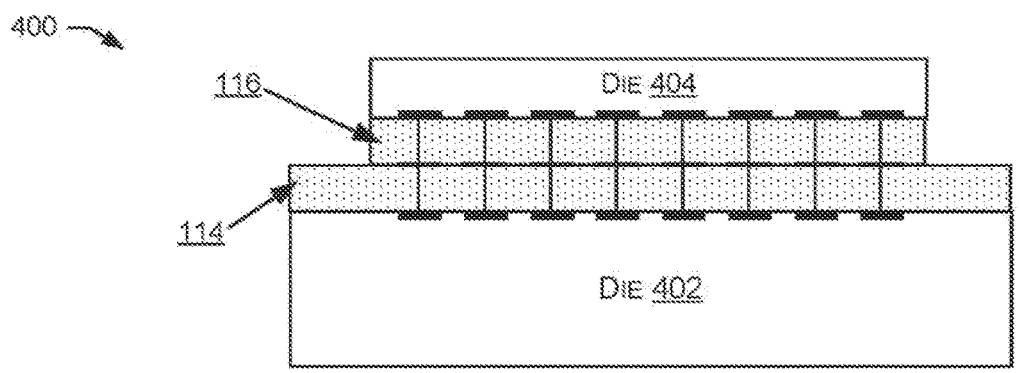
FIGS. 4A-4C are diagrams of an example micropackage and molding encapsulation fabricated by direct-bonding dies of a first footprint size to dies of a second footprint size in a wafer level process.
Figure 4B:
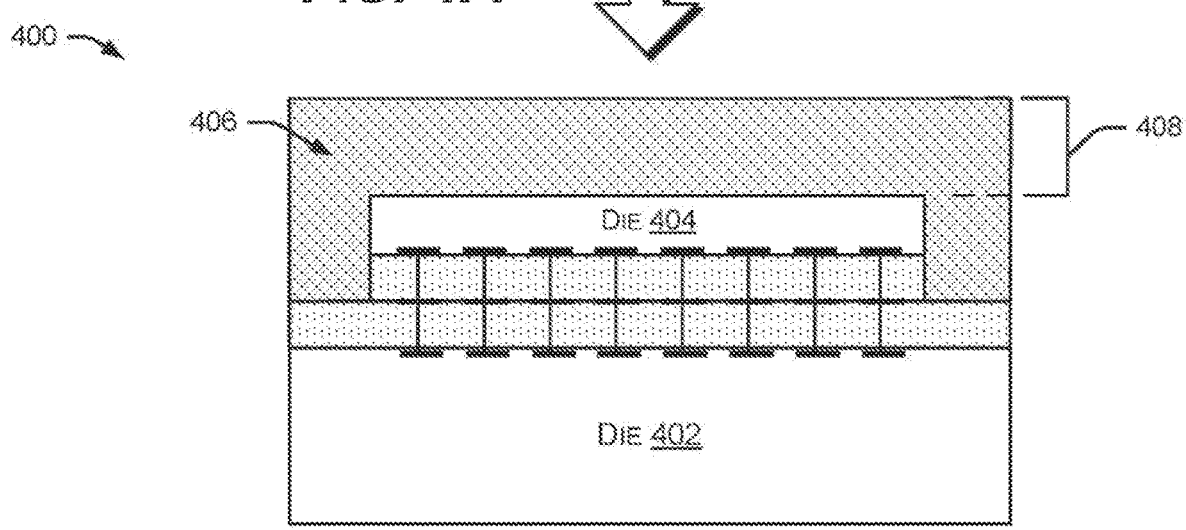
Figure 4C:
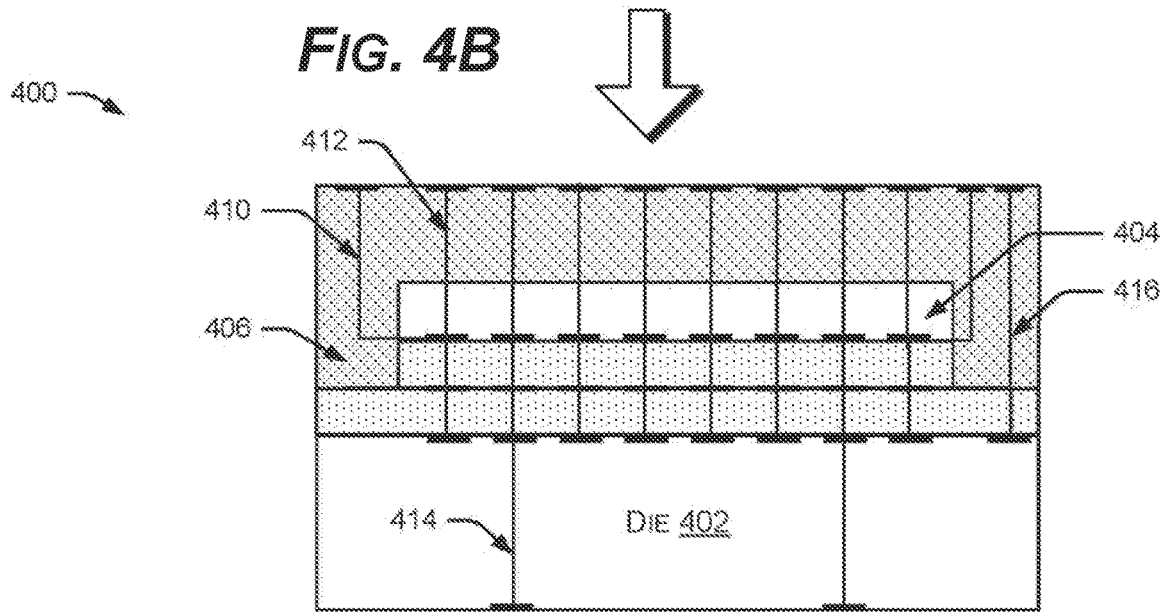

FIGS. 4A-4C show another example microelectronics package 400 with molding material between dies also encapsulating the dies or filling out package dimensions. For example, referencing FIG. 4A, first dies 402 of a first type, first footprint, and first dimensions are direct-bonded to dies 404 of a second type, second footprint, and second dimensions, with intervening dielectric layers 114 and 116. The dies 402 and 404 are physically and electrically connected by direct hybrid bonding, in which the dielectric layers 114 and 116 direct-bond to each other with dielectric-to-dielectric direct bonds, and metal interconnects, pads, and/or vias direct-bond to each other across the bonding interface with metal-to-metal direct bonds.

Turning to FIG. 4B, in this embodiment, a molding material 406 is applied to at least partially fill-in spaces that occur horizontally between the second dies 404. The molding material 406 also forms a layer 408 above the top of the second dies 404, to encapsulate the dies 404, complete the package, fill a void, and/or to form a filler layer 408 for continuing fabrication of the micropackage 400 above the top of the layer 408 of the molding material 406. The molding material 406 may also fill-in vertical spaces above some dies 404 of the second layer that are shorter in vertical height than other dies 404 of the second layer. Conductive leads of the shorter second dies 404 may be extended with through-vias to a top surface of the second layer of dies 404, or to a next layer of dies, or to an outside surface of the example micropackage 400.

The molding material 406 ideally has a similar CTE as the dies 404 or dielectric 116 (or silicon) that the molding material 406 is intervening between and/or encapsulating. The molding material 406 may be a compound such as a filler material, a resist compound, silicon, a high thermal conductivity compound, formed diamond, deposited diamond, formed aluminum nitride, deposited aluminum nitride, a material with a CTE close to a CTE of silicon, a packaging material, or a board material, for example.

Turning to FIG. 4C, through vias 410 and 412 and 414 and 416 can extend from any contact pads of any of the dies 402 and 404 in the micropackage 400 to any side of the micropackage 400 for external connection, traversing through the molding material 406 as needed.

The first dies 402 and/or the molding material 406 may be thinned as needed for further layering or packaging.

Figure 5A:
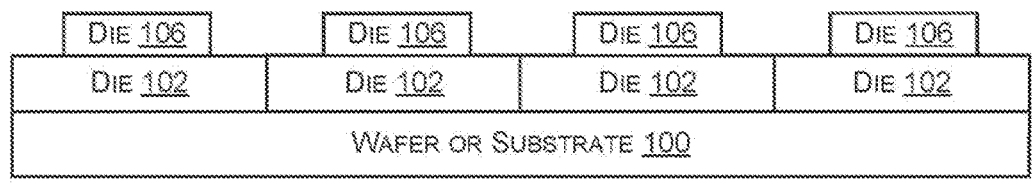
FIGS. 5A-5E are diagrams of a process for producing multilayered structures of stacked dies, wherein variegated dies of the various layers have various sizes, types, and dimensions.
Figure 5B:
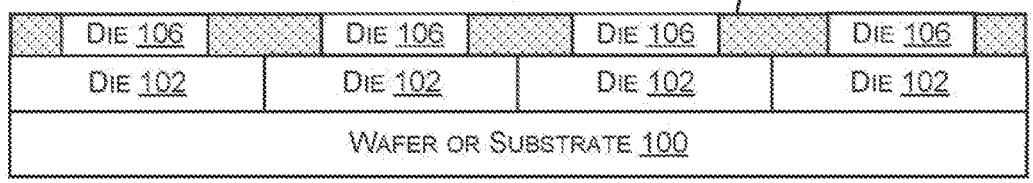
Figure 5C:
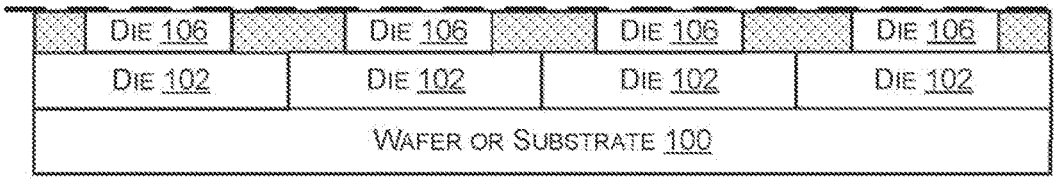

FIGS. 5A-5C show an example process for making a microelectronic device with variegated dies direct-bonded in multiple layers. The variegated dies of FIGS. 5A-5C can be logic dies, image sensor dies, high bandwidth memory (HBM) dies, and so forth.

In FIG. 5A, all direct bonds or direct hybrid bonds shown between dies can be direct bonds formed between surfaces of the dies themselves, or can be direct bonds formed via one or more intervening dielectric bonding layers (not shown explicitly). The dielectric bonding layers (not shown in FIGS. 5A-5C) can contain metal interconnects or through-vias for vertically extending electrical contacts through the dielectric bonding layers. Examples of dielectric layers 114 and 116 can be seen in FIGS. 1A, 1B, and 2A-2C.

A substrate, carrier or wafer 100 has first dies 102, and at least some of the first dies 102 have a first footprint size and specific physical dimensions. Second dies 106 with a second footprint size and/or different physical dimensions than the footprint size and physical dimensions of the first dies 102.

Contact pads of the dies, electrical connections, interconnects, fan-out lines, redistribution traces, and RDLs are not shown explicitly in FIG. 5, but leads of the dies 102 and 106 are direct-bonded together across the bonding interfaces either directly, or through vertical interconnects in dielectric bonding layers between the dies 102 and 106.

Turning to FIG. 5B, molding material 500 is placed horizontally between the dies 106 to at least partly fill the empty spaces between the dies 106.

Turning to FIG. 5C, the top surface of the second dies 106 and the molding material 500 can be planarized to make a surface for direct bonding or direct hybrid bonding another layer of variegated dies on top of the second dies 106. The planarization can be chemical mechanical polishing (CMP) to impart flatness and surface characteristics sufficient for direct bonding.

Figure 5D:
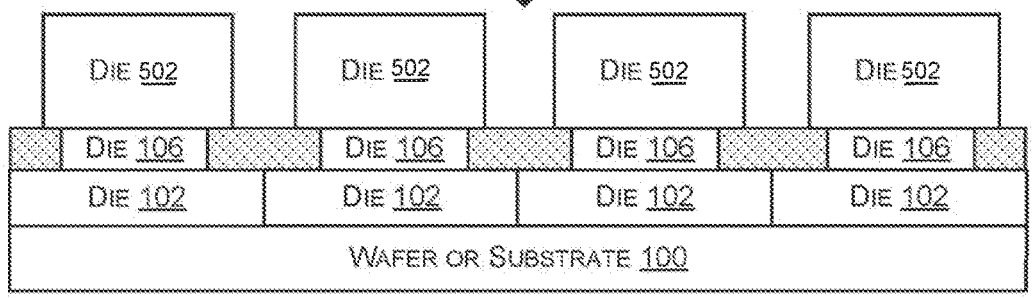

Turning to FIG. 5D, third dies 502 can be direct bonded or direct hybrid bonded to the second dies 106. The third dies 502 can be variegated dies with footprints, foundry nodes, wafer origins, functionalities, and physical dimensions different than second dies 106, and may also be different than the first dies 102. The various dies 102 and 106 and 502 do not have to be different from each other in size, footprint, foundry node, functionality, and so forth, but the example process shown in FIG. 5 makes such stacking of variegated dies 102 and 106 and 502 possible in a wafer level process.

Figure 5E:
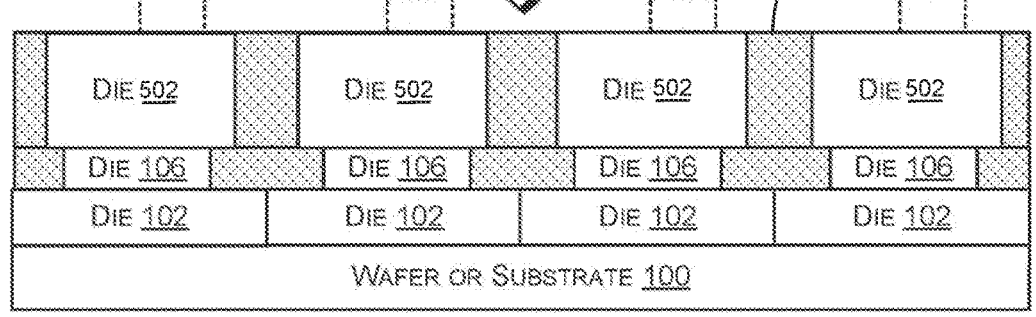

Turning to FIG. 5E, another round of molding material 504, which may be the same material or a different material than molding material 500 used in the second layer, is applied between the third dies 502 in the third layer to at least partly fill the empty spaces horizontally between the dies 502 of the third layer. The top surfaces of the third dies 502 and the molding material 504 of the third layer are planarized to make a surface for direct bonding or direct hybrid bonding another layer of variegated dies, if desired, on top of the third layer of dies 502. The planarization can be CMP to impart flatness and surface characteristics sufficient for direct bonding.

The process can continue with direct-bonding or direct hybrid bonding of each new layer of variegated dies, filling-in intervening spaces between dies of each new layer with molding material, and then planarizing the top of the dies and the molding material for direct bonding of the next layer of dies.

Dies 102 in the first layer 104 have a front side layer of metal contacts 110 providing electrical contacts and/or redistribution traces for integrated circuits of the dies 102. The metal contacts 110 can be built up into a bonding layer with interconnects for direct-bonding to the second dies 106, or in some cases the metal contacts 110 can be bonded directly to the second dies 106 without further buildup of RDLs or further vertical extension using through-vias.

Although not shown in FIGS. 5A-5E, conductive through-vias, conductive interconnects, leads, redistribution traces, fan-outs, and RDLs can be routed in the microelectronics package, including through the molding materials 500 and/or 504, to connect the dies 502 and 506 and 514 to each other, and/or to contact pads on the outside of the microelectronics package.

Figure 6A:
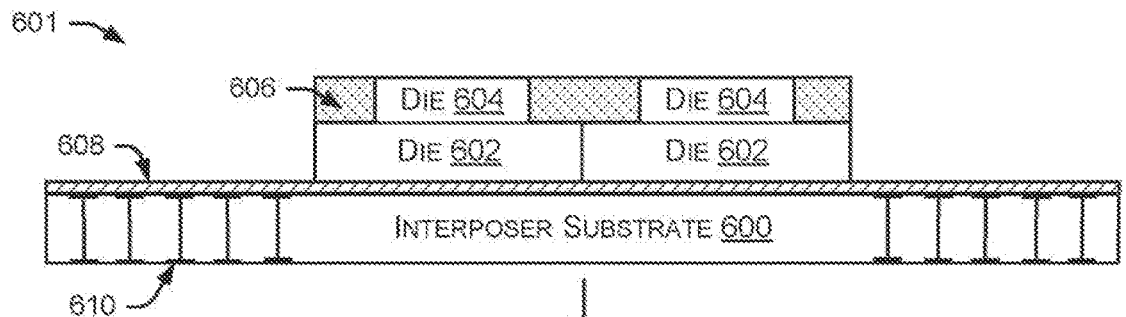
FIGS. 6A-6C are diagrams of example interposers with variegated dies in multiple layers on one or both sides of the interposers by direct-bonding dies of a first footprint size to dies of a second footprint size in a wafer level process.
Figure 6B:
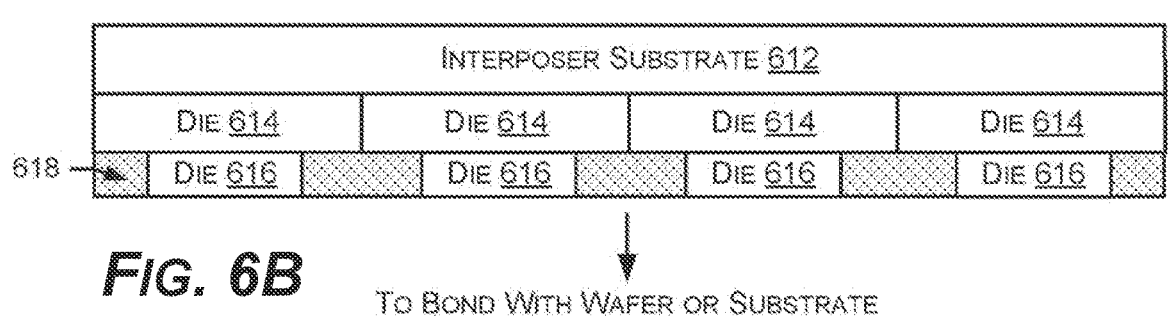
Figure 6C:
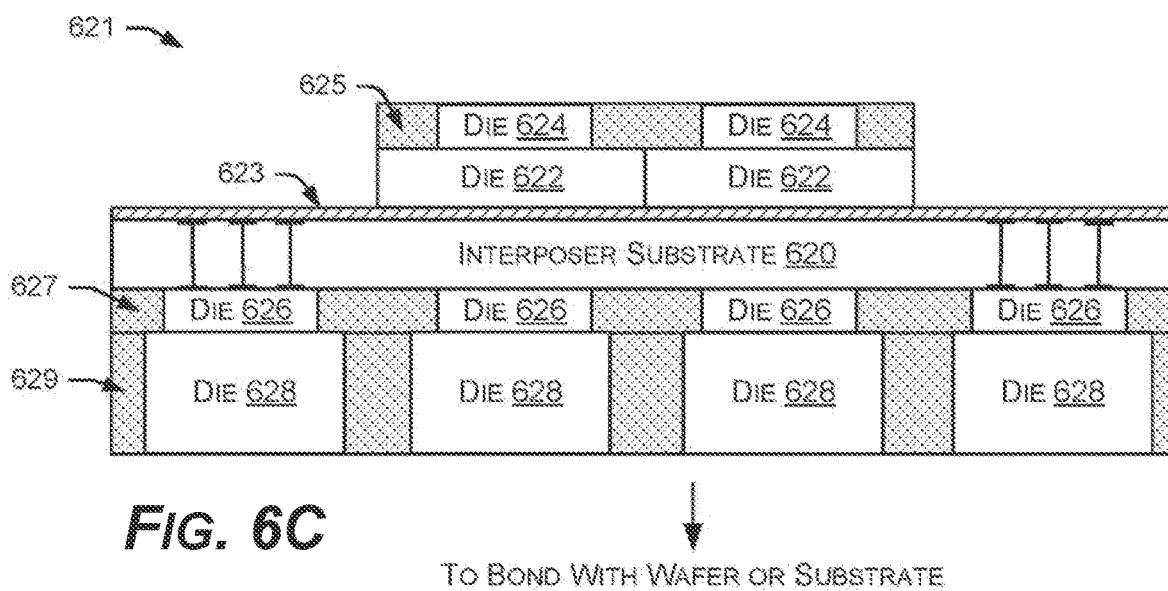

FIGS. 6A-6C show different example configurations of interposer devices built according to the processes described herein. The example interposers can be used in 2.5D integrated circuit technology, for example, to provide several benefits.

First, variegated dies of various different footprint sizes, types, foundry nodes, wafer origins, physical dimensions, and so forth, can be mixed and matched not only on one side, but on both sides of an interposer substrate that is silicon, organic, or other material. The included variegated dies can be bonded together into the interposer package with direct bonding techniques instead of solder ball arrays, for example, although solder ball arrays are not excluded. The direct bonding or direct hybrid bonding can create ultra-high density routing between dies. Moreover, KGDs (known good dies) can be used to construct the example interposers, increasing production yield.

The interposers can then be reconstituted onto a semiconductor wafer, or other silicon or organic substrate, for example, or onto the package substrate of microelectronic devices making an efficient way to create such micropackages using wafer level processes to provide smaller size and higher bandwidth, and with less expensive techniques than are possible with conventional ball grid array interconnects and conventional wafer reconstitution processes.

The example interposers shown and described can help to decrease interconnection length between multiple dies assembled on the example interposers. This increases the number of interconnection routes for the interposer with stacked structure of variegated dies, saves power consumption, decreases latency, and increases bandwidth compared to conventional interposers.

Turning to FIG. 6A, a first example interposer 601 has an interposer substrate 600 with a first layer of dies 602 and a second layer of different dies 604 direct-bonded to the first layer of dies 602. A molding material 606 at least partly fills-in the spaces between the dies 604 in the second layer. The molding material 606 may also continue horizontally over the dies 604 to encapsulate the dies 604 (not shown) and complete the interposer package. The interposer 600 may use one or more RDLs 608 to distribute or fan-out traces. Interconnects and through-vias 610 can be leveraged anywhere in the package, including through the molding material 606 depending on application and need (not shown). The example through-vias 610 can also pass through the interposer substrate 600 and connect to a package substrate, to a wafer, or even to another interposer via contact pads disposed on an external surface of the interposer substrate 600, for example (not shown).

Turning to FIG. 6B, a second example interposer 611 with an interposer substrate 612 has a layer of first dies 614 of a first type, and a layer of second dies 616 of a second type direct-bonded to the first dies 614. The dies 614 and 616 may differ from each other in footprint size, functionalities, physical size, foundry node, wafer origin, and in many other specifications, but can be combined together in a wafer level process using the molding material 618 to make direct-bondable layers for making multiple levels of stacked dies 614 and 616 . . . n, in the example interposer. The interposer 611 may interface with a wafer or other devices via its interposer substrate 612 or via die 616 positioned to present front contacts of backside TSV reveals to the interface (not shown).

Turning to FIG. 6C, a third example interposer 621 has an interposer substrate 620, a layer of first dies 622 of a first type on distribution lines 623 or on one or more RDLs, for example, and a second layer of dies 624 of a second type direct-bonded to the first layer of dies 622. The dies 622 and 624 do not have to be different types, they can be the same type of die, but the example process and structures allows the dies 622 and 624 to be very different from each other. A molding material 625 fills-in spaces between dies 624 of the second layer and can also encapsulate (not shown) the dies 624 or can encapsulate (not shown) the entire top side of the interposer package 621.

On an opposing side of the interposer substrate 620, a third layer of dies 626 are bonded and electrically connected if applicable, with another molding material 627 or the same molding material used above filling in spaces between dies 626. A fourth layer of dies 628, which is the second layer on this opposing side of the interposer substrate 620 are direct-bonded to the third layer of dies 626, with another molding material 629 filling-in spaces between the dies 628 of the fourth layer and can also encapsulate (not shown) the dies 628 or can encapsulate (not shown) the entire bottom side of the interposer package 621. Through-vias, distribution traces, and contact pads can be disposed anywhere in, or on the outside of the interposer package 621, traversing any of the molding material 625 and 627 and 629 as needed for routing. Thus, the interposer package 621 can interface with a wafer or other devices via either top or bottom connections, or both.

The example interposers 601 and 611 and 621 can be used to make HBMs, with high density routing. Memory dies can be stacked on the interposers along with dies providing the main processor and HBM controller. The example interposers 601 and 611 and 621 can also be used for other high performance computing applications, artificial intelligence (AI), graphic processors, image sensors, and other applications.

Example Image Sensor Structures and Processes

Example image sensor devices are now described as example embodiments of the stacked die structures and associated processes shown and described above in FIGS. 1A-6C. Both backside illuminated and front-side illuminated image sensors and associated methods of fabrication are described using the processes of making stacked die structures of FIGS. 1A-6C.

Front-side illumination refers to light entering photo diode elements through a BEOL layer of metal wiring built on the front side of the photo diode elements. A bond interface with a logic chip is on the backside of the photo diode elements die, faced away from the incoming light. Back-side illumination refers to light entering the photo diode elements on the side of the backside of the photo diode elements die, with the BEOL metal wiring layer on the opposing front side of the photo elements die. The BEOL metal wiring layer (on the front side, away from the incoming light) faces the bond interface with the logic chip.

This disclosure is not limited to the use of image sensor wafers and is more generally applicable to semiconductor wafers, for example complementary metal-oxide semiconductor (CMOS) wafers, which have a BEOL front side disposed on an active device layer which can be facing toward or away from a bond interface.

Figure 7A:
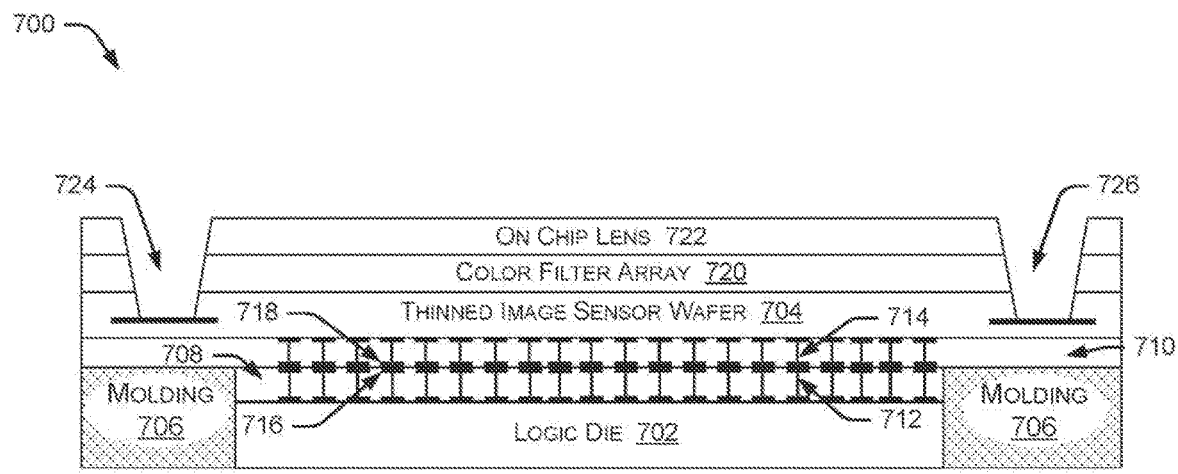
FIGS. 7A and 7B are diagrams of a first example backside illuminated image sensor structure.

FIG. 7A is a diagram of a first example backside illuminated image sensor structure 700. Generally, the example backside illuminated image sensor structure 700 can be made by direct hybrid bonding of logic dies 702 of a first footprint size, to a front side of an image sensor wafer 704 in a D2W process, and optionally filling-in spaces between the logic dies 702, either fully or partly, with a molding compound 706, a resist material, a silicon spacer material, glass, or a thermally conductive compound, for example. The direct hybrid bonding between photo diode element dies on the image sensor wafer 704 and the logic dies 702 may be intermediated by dielectric layers 708 and 710 with through-vias 712 and 714 and contact pads 716 and 718 suitable for direct hybrid bonding.

The image sensor wafer 704 may be a 200 millimeter wafer, or of other size, and the logic dies 702 can also be of various sizes, for example logic dies 702 from a 300 millimeter wafer, for example.

The direct hybrid bonding can be a direct bond interconnect (DBI®) hybrid bonding process, for example, or other process that direct-bonds dielectric surfaces together while direct-bonding the metal contact pads 716 and 718 together in steps of the same direct-bonding operation.

A support carrier (not shown in FIG. 7) may optionally be direct bonded to at least the logic dies 702 using an intervening dielectric, for example. Imaging layers such as a color filter array 720 and on-chip lens 722, for example, may be deposited, bonded or direct-bonded to the image sensor wafer 704.

Last metal contact pads 724 and 726 may be etched out to make package interconnects, or other interconnect methodologies may be implemented through routing lines and through-vias, including routing lines and through-vias directed through the molding material 706.

An example process for making the example backside illuminated image sensor structure 700 includes obtaining an image sensor wafer 704 that has photo-diode arrays or pixel arrays, the arrays of a first size. The example process creates microcircuits and bonding pads on a front-side of the image sensor wafer 704, the bonding pads suitable for direct hybrid bonding. The process continues with obtaining a logic die 702 of a second size, for example, the second size can be smaller than the first size of the photo-diode arrays or the pixel arrays of the image sensor wafer 704. Microcircuits and bonding pads for direct hybrid bonding are also made on the logic die 702.

Next, the example process joins the logic die 702 to at least one photo-diode array or pixel array of the image sensor wafer 704 with a hybrid bonding technique to form a mechanical and electrical connection between the bonding pads of the logic die 702 and the bonding pads of the image sensor wafer 704.

The molding material 706 may be added to extend the logic die, which may have a variety of sizes, to match the larger size of the photo-diode array or pixel array when needed, or to partially or fully fill in horizontal spaces in the horizontal layer containing the logic die(s) 702. The molding material 706 can be a molding compound, passive silicon, a glass, a thermally conductive material, or other suitable material. The filler material may also be formed or deposited diamond, formed or deposited aluminum nitride, a material with a CTE close to a CTE of silicon, a packaging material, and a board material, for example. The molding material 706 may have a high thermal conductivity, and may extend below the logic dies 702 to dissipate heat and hot spots in the image sensor wafer 704 (not shown). The molding material 706 may also extend below the logic dies 702 to add mechanical strength to the layer of the logic dies 702 (not shown). If passive or dummy silicon is the filler material, the silicon may be applied as a spin coating, for example.

Figure 7B:
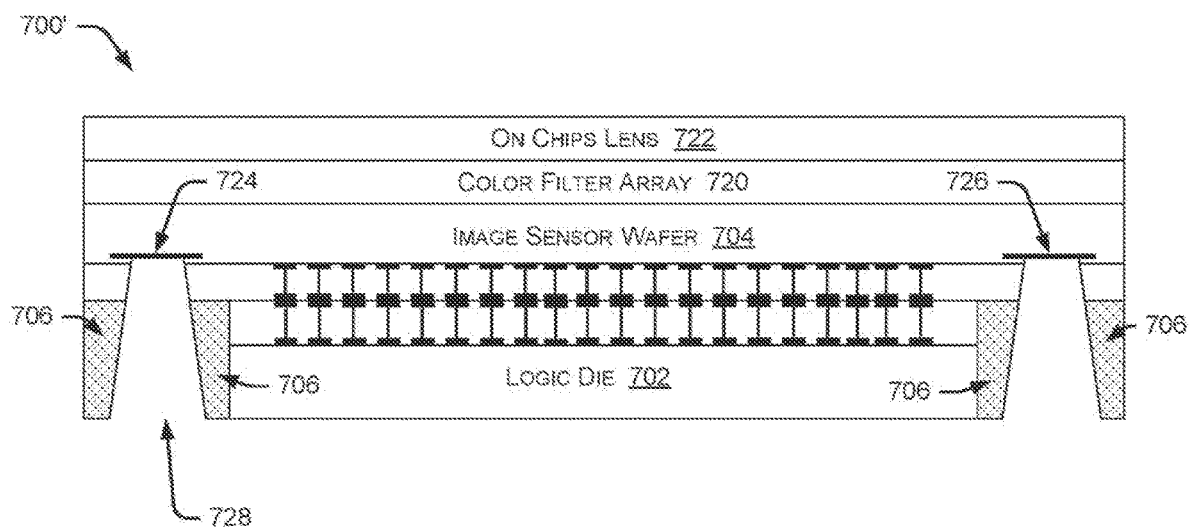

FIG. 7B illustrates a structure 700' that shows a variation of the example backside illuminated image sensor package 700, in which access to the bonding pads 726 and 726 is obtained through vias created on the front side of the image sensor package 700'.

In the example process, the joining may direct-bond logic dies 702 of one size, from a 300 millimeter wafer, for example, to image sensor wafers 704 on a 200 millimeter image sensor wafer 704, for example. The direct-bonding can additionally be a direct hybrid bonding process, such as a DBI® hybrid bonding process for fine-pitch hybrid bonding. The bonding can also be a direct oxide bonding process, such as oxide bonding in the context of TSVs, for the electrical interconnects. A suitable example oxide bonding technique for this scenario can be a ZiBond® direct oxide bonding process, for example, or another direct-bonding process. The photo-diode arrays or pixel arrays of the image sensor wafer 704 may comprise CMOS image sensors (CIS), or other types of image sensors.

The logic dies 702 may include logic driver circuitry or memory, such as DRAM, or both logic driver circuitry and DRAM memory for the photo-diode arrays or pixel arrays. The photo-diode arrays or pixel arrays are on a backside of the image sensor wafer 704 for BSI implementations, and the example process may include thinning the backside of the image sensor wafer 704.

The example process continues with depositing the color filter array 720 and an on-chip lens 722 onto the thinned backside of the image sensor wafer 704. Then, the process includes creating openings to the contact pads 724 and 726 of the photo-diode arrays or pixel arrays through a backside of the image sensor wafer 704. The contact pads 724 and 726 are usually chip-to-package bonding sites. In a variation, openings to the contact pads 724 and 726 can also be made from the front-side 728 of the image sensor package, an in example backside illuminated image sensor structure 700'. In structure 700', the openings to the contact pads 724 and 726 are made through the molding material 706 to the front-side 728 of the image sensor wafer 704. In another implementation, the openings to the contact pads 724 and 726 are made through a bond via array (BVA) process.

Figure 8A:
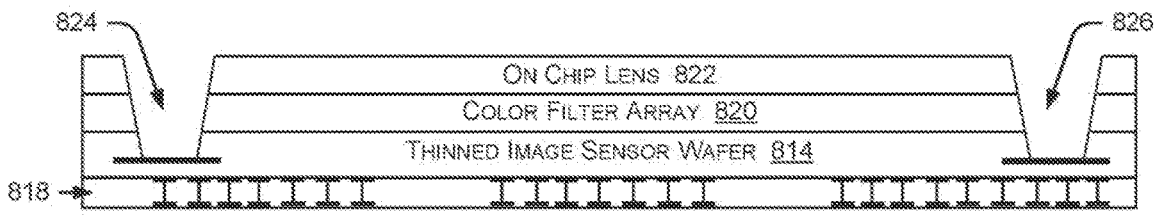
FIGS. 8A-8C are diagrams of a second example backside illuminated image sensor structure.
Figure 8B:
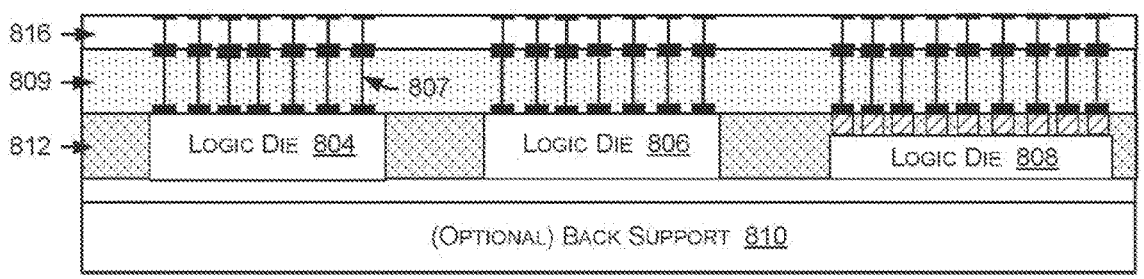
Figure 8C:
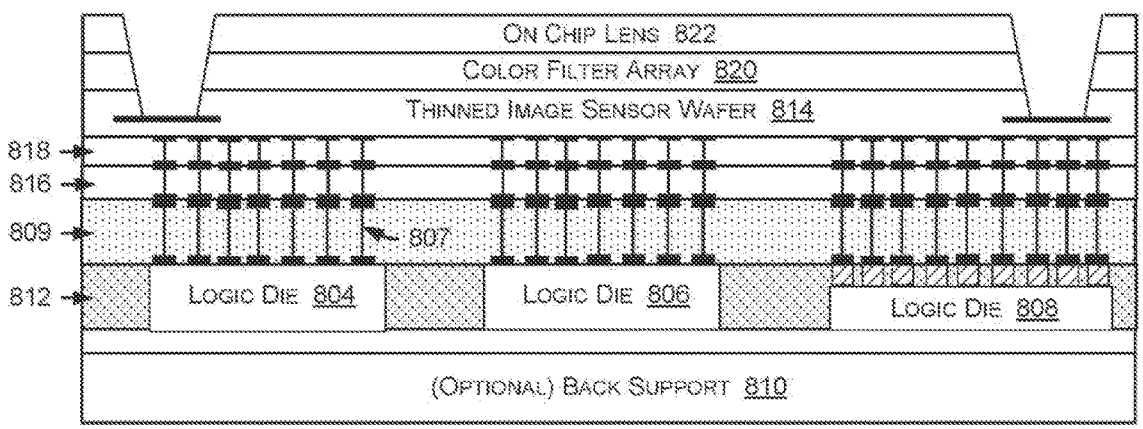

FIG. 8C shows a second example backside illuminated image sensor structure 801, comprising a reconstituted wafer 800 an image sensor portion 802 of the package. At FIG. 8B, a reconstituted wafer 800 is fabricated by bonding logic dies 804 and 806 and vertically shorter logic die 808, for example, to a carrier wafer 809. The logic dies 804 and 806 and 808 and carrier 809 may optionally be bonded or adhered to a back support 810 for extra strength if desired. Horizontal spaces between the logic dies 804 and 806 and 808 are at least partially filled with a molding material 812. A direct hybrid bonding layer 816 of dielectric material and metal interconnects tops off the reconstituted logic package 800.

Turning to FIG. 8A, in an image sensor portion 802 of the package, an image sensor wafer 814 of optionally different size and foundry origin than the logic dies 804 and 806 and 808 is surmounted by a color filter array 820, and an on chip lens 822. The image sensor wafer 814 is thinned, and a direct hybrid bonding layer 818 of dielectric and metal interconnects is added. The reconstituted logic part of the package 800 and the image sensor portion of the package 802 are now direct hybrid bonded together to make the backside illuminated image sensor. Bond pads of the thinned image sensor wafer 814 are exposed for connection to a microelectronic device.

Turning to FIG. 8C, an example process for making the example backside illuminated image sensor structure 800 and 802 of FIG. 8 includes creating conductive vias 807 in the carrier wafer 809, bonding the logic dies 804 and 806 and 808 of a first footprint size, such as dies from a 300 millimeter wafer, to the conductive vias 807 of the carrier wafer 809 using direct hybrid bonding or a surface mount technology, adding the molding material 812 between the logic dies 804 and 806 and 808 to make a reconstituted logic wafer 800 on the carrier wafer 809, thinning the carrier wafer 809 to expose the conductive vias 807 on an opposing side of the carrier wafer 809, and adding a direct bonding layer 816 to the exposed conductive vias 807 of the carrier wafer 809. An optional back support wafer 810 may be attached to the reconstituted logic wafer. The example process further includes adding a direct bonding layer 818 to an image sensor wafer 814, and then joining the reconstituted logic wafer 800 to the image sensor wafer 802 by bonding the respective direct hybrid bonding layers 816 and 818 to each other.

At this point, the example process then includes thinning a backside of the image sensor wafer 814, and depositing a color filter array 820 and an on-chip lens 822 on the thinned backside of the image sensor wafer 814. The process then opens vias to contact pads 824 and 826 of the image sensor wafer 814 through the color filter array 820 and the on-chip lens 822.

The molding material 812 may be a mold compound, a resist compound, silicon, a high thermal conductivity compound, formed or deposited diamond, formed or deposited aluminum nitride, a material with a CTE close to a CTE of silicon, a packaging material, and a board material. The molding material may have a high thermal conductivity and may extend below the logic dies 804 and 806 and 808 to dissipate heat and hot spots in the thinned image sensor wafer 814 (not shown). The molding material 812 may also extend below the logic dies 804 and 806 and 808 to add a mechanical strength to the layer of the logic dies 804 and 806 and 808 (not shown).

Figure 9:
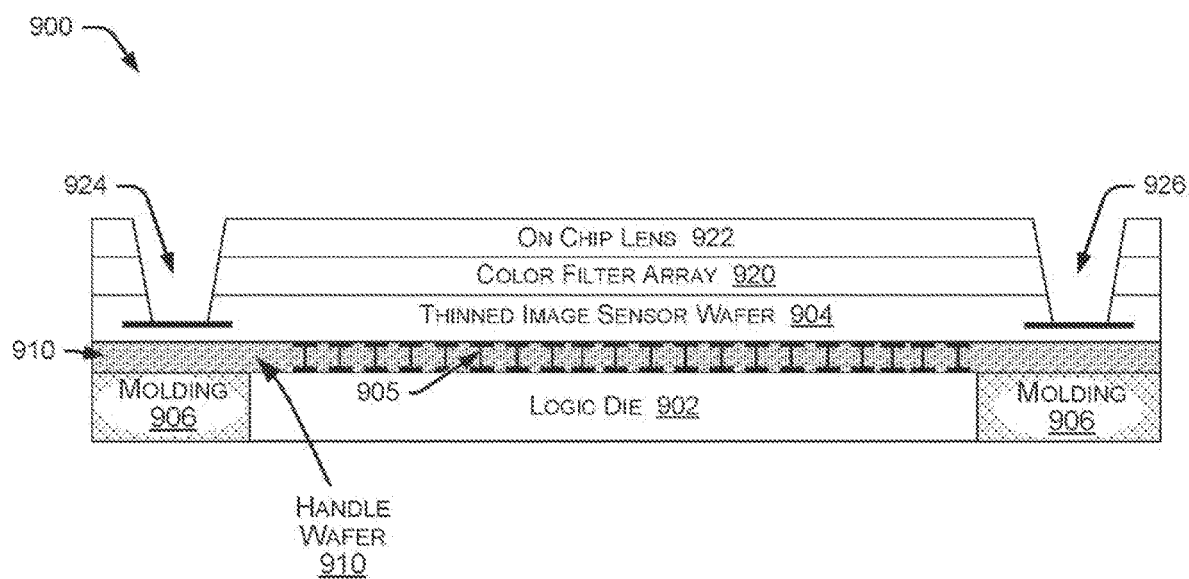
FIG. 9 is a diagram of a third example backside illuminated image sensor structure.

FIG. 9 shows another example backside illuminated image sensor structure 900. This example structure 900 attaches logic dies 902 to a thinned handle wafer 910 during fabrication. Handle wafer 910 may also or alternatively be thinned after logic die 902 attachment. The example process creates TSVs 905 through the handle wafer 910 for coupling the logic dies 902 to the thinned image sensor wafer 904. Additionally or alternatively, the TSVs 905 may be formed by a via first, via middle, or via last process and some or all of the interconnections could be made by more traditional means, including through the use of solder connections.

An example process for making the example backside illuminated image sensor structure 900 of FIG. 9 includes planarizing the image sensor wafer 904 to make a thinned image sensor wafer 904 that has chip-to-package conductive contact pads 924 and 926 and has conductive bonding pads for connection to the logic dies 902. The process direct-bonds a front-side of the thinned image sensor wafer 904 to a first handle wafer 910, attaching a temporary second handle wafer (not shown) to a backside of the thinned image sensor wafer 904 using a temporary dielectric layer that is direct-bonded between a backside of the thinned image sensor wafer 904 and the temporary second handle wafer. Image sensor wafer 904 may also or alternatively be thinned after direct-bonding to the first handle wafer 910. The process thins the first handle wafer 910 attached to the front-side of the thinned image sensor wafer 904, and creates the conductive TSVs 905 through the thinned first handle wafer 910, with first ends of the TSVs 905 conductively coupled to the bonding pads of the image sensor wafer 904. The process adds a layer of bonding pads to second ends of the TSVs 905, then direct-bonds the logic dies 902 to the bonding pads on the thinned first handle wafer 910. The process adds a molding compound 906, resist material, or silicon spacers in the horizontal spaces around the logic dies 902, then removes the temporary first handle wafer (not shown) and the temporary dielectric layer from the backside of the thinned image sensor wafer 904. The process exposes the conductive contact pads 924 and 926 of the thinned image sensor wafer 904 from the backside of the thinned image sensor wafer 904, and then deposits a color filter array 920 and an on-chip lens 922 onto the backside of the thinned image sensor wafer 904. Conductive contact pads 924 and 926 of the thinned image sensor wafer 904 may alternatively be exposed after deposition of the color filter array 920 and/or on-chip lens 922.

The thinned image sensor wafer 904 may be a 200 millimeter wafer, and the logic dies can be from a 300 millimeter wafer, for example.

For bonding techniques, the example process may include direct hybrid bonding the logic dies 902 to the layer of bonding pads on the thinned first handle wafer 910. The direct hybrid bonding may be DBI® brand of direct hybrid bonding, for example. The example process may include direct hybrid bonding the first ends of the TSVs 905 to the bonding pads of the image sensor wafer 904. The temporary dielectric layer can be direct bonded between the backside of the thinned image sensor wafer 904 and the temporary second handle wafer (not shown) using a ZiBond® direct bonding process, for example.

In an implementation, the image sensor wafer 904 has a 3-10 micron thickness of silicon and less than a 5 micron thickness of BEOL layers. The first handle wafer 910 can either be thinned to greater than approximately 10 microns for greater downstream mechanical integrity or thinned to less than approximately 10 microns for simplifying subsequent processing.

The second handle wafer (not shown) can be a 200 millimeter wafer with an initial thickness of approximately 750 microns. A layer containing the logic dies and the molding compound, the resist material or silicon spacers can be greater than 50 microns thick. The molding compound 906 can be a mold material, a resist compound, silicon, a high thermal conductivity compound, formed or deposited diamond, formed or deposited aluminum nitride, a material with a CTE close to a CTE of silicon, a packaging material, and a board material. The molding compound 906 may have a high thermal conductivity and may extend below the logic dies 902 in order to dissipate heat and hot spots in the thinned image sensor wafer 904 (not shown). The molding compound 906 may also extend below the logic dies 902 to add mechanical strength to the layer of the logic dies 902 (not shown).

Figure 10A:
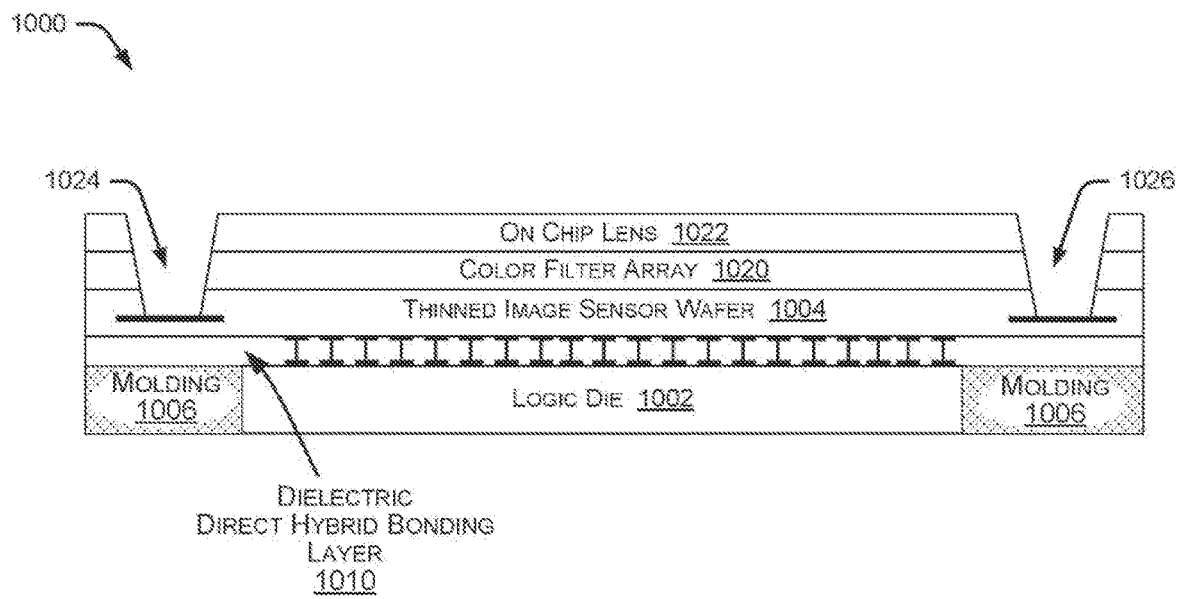
FIGS. 10A and 10B are diagrams of a fourth example backside illuminated image sensor structure.

FIG. 10A and/or 10B shows another example backside illuminated image sensor structure 1000, which features fabrication using a temporary image sensor handle wafer, without a permanently incorporated handle wafer 910 of FIG. 9.

An example process for making the image sensor structure 1000 of FIG. 10A and/or 10B includes planarizing an image sensor wafer 1004 to make a thinned image sensor wafer 1004, wherein the thinned image sensor wafer has chip-to-package conductive contact pads 1024 and 1026 and has conductive bonding pads for connection to logic dies 1002. The process direct-bonds a front-side of the thinned image sensor wafer 1004 to a first handle wafer (not shown) via a first dielectric layer (not shown), then direct-bonds the backside of the thinned image sensor wafer 1004 to a second handle wafer (not shown) via a second dielectric layer. The process removes the first handle wafer from the front side of the thinned image sensor wafer 1004 while leaving the first dielectric layer in place, adding direct hybrid bond conductors and through dielectric vias (TDVs) 1005 to the first dielectric layer to convert the first dielectric layer to a direct hybrid bonding layer 1010. The process bonds logic dies 1002 to the direct hybrid bonding layer 1010 via direct hybrid bonds, and adds a molding compound 1006 into the horizontal spaces around the logic dies 1002. The molding compound 1006 can be a filler, a resist material, or silicon spacers, for example. The process then removes the second handle wafer (not shown) and the second dielectric layer from the backside of the thinned image sensor wafer 1004, and exposes the conductive contact pads 1024 and 1026 of the thinned image sensor wafer 1004 from the backside of the thinned image sensor wafer 1004. The process deposits a color filter array 1020 and an on-chip lens 1022 onto the backside of the thinned image sensor wafer 1004.

The thinned image sensor wafer 1004 can be a 200 millimeter wafer, and the logic dies 1002 may be diced from a 300 millimeter wafer, for example.

Figure 10B:
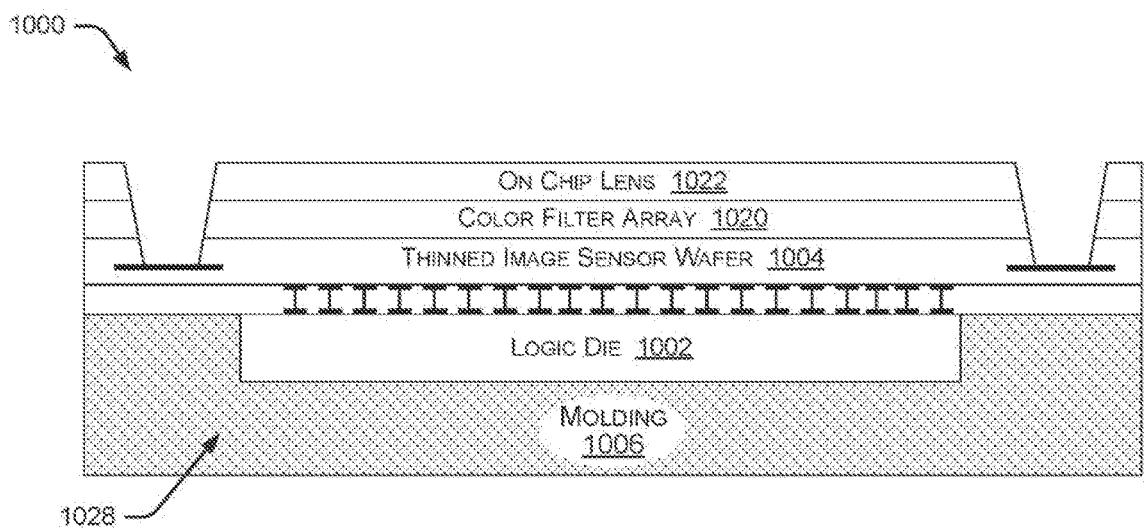

The molding compound 1006 can be a filler material, a resist compound, silicon, a high thermal conductivity compound, formed or deposited diamond, formed or deposited aluminum nitride, a material with a CTE close to a CTE of silicon, a packaging material, and a board material. The molding compound 1006 can have a high thermal conductivity and may extend below the logic dies 1002 as shown in FIG. 10B at 1028 to dissipate heat and hot spots in the thinned image sensor wafer 1004, and/or provide mechanical strength to the layer of logic dies 1002.

Figure 11:
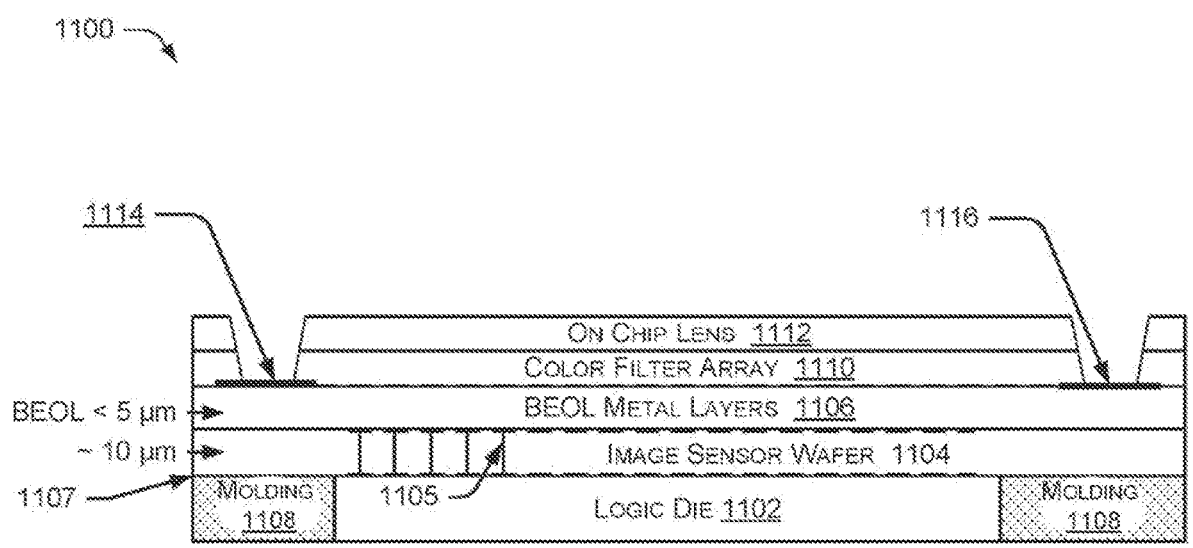
FIG. 11 is a diagram of a first example front-side illuminated image sensor structure.

FIG. 11 shows a first example of a front-side illuminated image sensor structure 1100, made via the example processes described with respect to FIGS. 1-6. FIG. 11 can be distinguished from the sensor structures of FIGS. 7A-10B, which are backside illuminated sensor structures. In the front-side illuminated image sensor structure 1100 of FIG. 11, light shines through BEOL layers 1106 on a front side of an image sensor wafer 1104.

An example process for fabricating the example front-side illuminated image sensor structure 1100 includes building back-end-of-line (BEOL) layers 1106 on a front side of an image sensor wafer 1104, direct-bonding a handle wafer (not shown) onto the BEOL layers via a dielectric layer (not shown), thinning a backside of the image sensor wafer 1104 to approximately 10 microns, for example; creating TSVs 1105 through the thinned image sensor wafer 1104, building a direct hybrid bond layer 1107 conductively coupled with ends of the TSVs 1105 on the backside of the thinned image sensor wafer 1104, and direct hybrid bonding logic dies 1102 to the direct hybrid bonding layer 1107.

The example process further continues with adding a filler or molding material 1108 around the logic dies 1102. The filler material can be a mold material 1108, a resist compound, silicon, a high thermal conductivity compound, formed or deposited diamond, formed or deposited aluminum nitride, a material with a CTE close to a CTE of silicon, a packaging material, and a board material. The filler material 1108 may have a high thermal conductivity and may extend below the logic dies 1102 to dissipate heat and hot spots in the thinned image sensor wafer 1104 and/or provide mechanical strength to the layer of logic dies 1102 (not shown).

The example process continues with removing the handle layer (not shown) and the dielectric (not shown) layer from the (top of the) BEOL layers 1106, opening contact pads 1114 and 1116 of the BEOL layers 1106 from a front side of the BEOL layers 1106, and depositing a color filter array 1110 and an on-chip lens 1112 to the BEOL layers 1106 to complete a front-side illuminated image sensor structure 1100 with logic dies 1102 direct hybrid bonded to the backside of the thinned image sensor wafer 1104.

The thinned image sensor wafer 1104 can be a 200 millimeter wafer, and the logic dies can be from a 300 millimeter wafer, for example. A thickness for the logic dies 1102 can be selected that provides sufficient mechanical strength for the package, i.e. front-side illuminated image sensor structure 1100.

Figure 12:
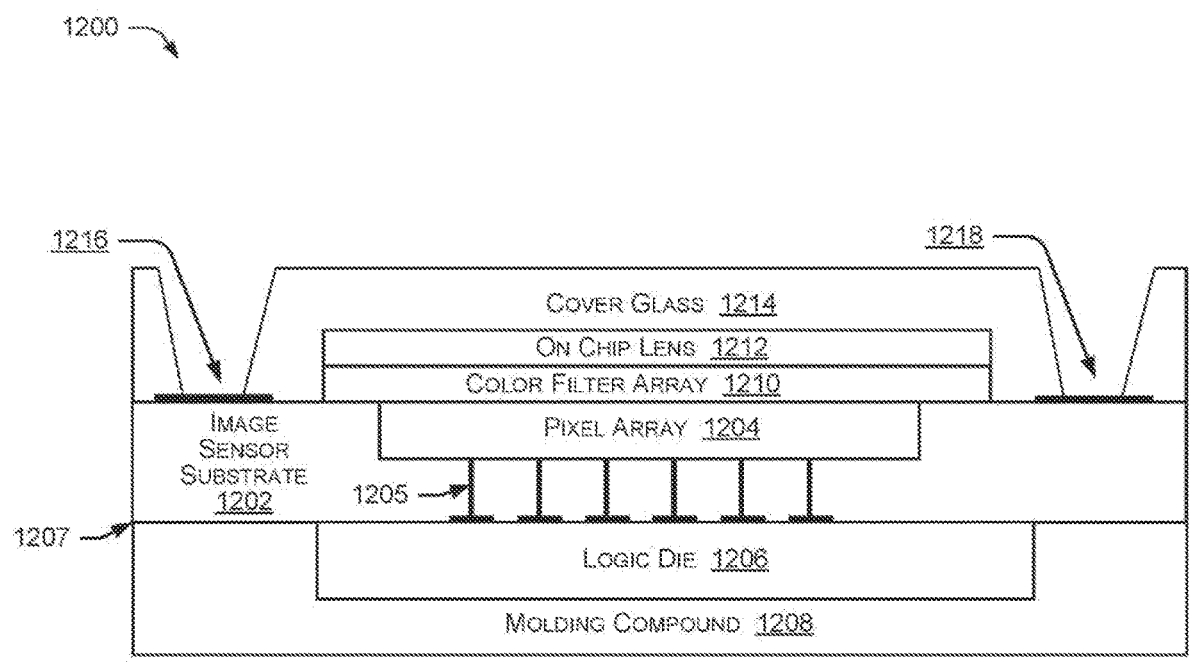
FIG. 12 is a diagram of a second example front-side illuminated image sensor structure.

FIG. 12 shows a second example front-side illuminated image sensor structure 1200. This implementation of a front-side illuminated image sensor structure 1200 uses molding material 1208 to fill-in packaging around logic dies 1206 of one size, bonded to image sensor substrate 1202 and pixel arrays 1204 of different sizes, all in a wafer level production process.

An example process making the front-side illuminated image sensor structure 1200 of FIG. 12 includes bonding a color filter array 1210 and on-chip lens 1212 to a front side of a pixel array 1204 on an image sensor substrate 1202 and then adding a cover glass 1214 over the on-chip lens 1212.

The example process then thins the backside of the image sensor substrate 1202, and creates though-vias 1205 and a direct hybrid bonding layer 1207 on the backside of the image sensor substrate 1202. The process attached logic dies 1206 to the direct hybrid bonding layer 1207 on the backside of the image sensor substrate 1202, and adds molding material 1208 or a high strength thermally conductive material laterally to the logic die 1206 and to the lateral edges of the image sensor substrate 1202. The molding material 1208 or the high strength thermally conductive material can extend in a layer below the logic dies 1206.

The thinned image sensor substrate 1202 can be from a 200 millimeter image sensor wafer, and the logic dies 1206 can be from a 300 millimeter wafer, for example. Contact pads 1216 and 1218 for package bonding are opened from the front side of the device.

Example Methods

Figure 13:
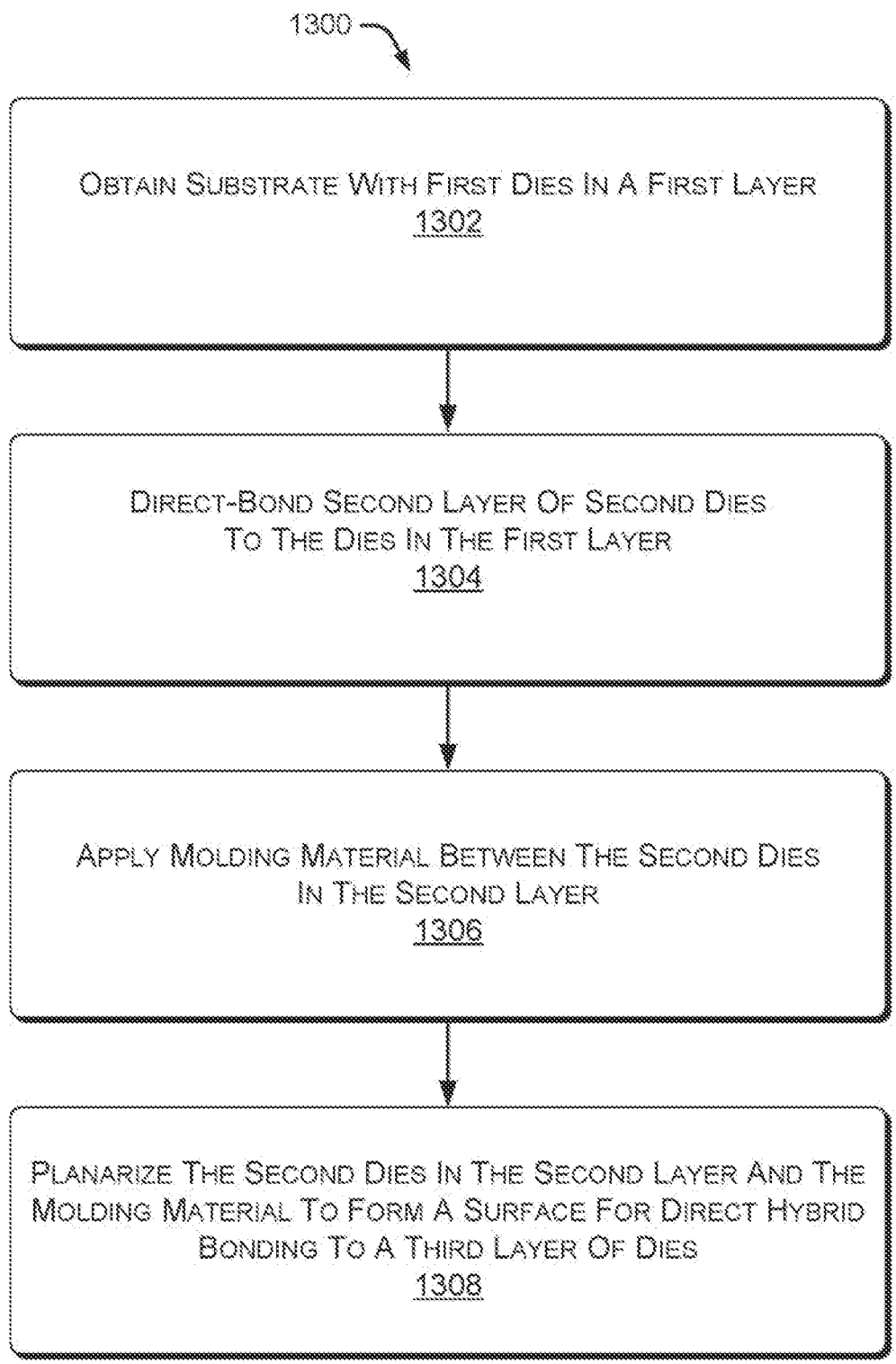
FIG. 13 is a flow diagram of an example method of fabricating direct-bonded stacked die structures in a wafer level process.

FIG. 13 shows an example method 1300 of fabricating direct-bonded stacked die structures in a wafer level process. Operations of the example method 1300 are shown in individual blocks.

At block 1302, a substrate with first dies in a first layer is obtained.

At block 1304, a second layer of second dies is direct-bonded to the first dies in the first layer.

At block 1306, a molding material is applied between the second dies in the second layer.

At block 1308, the second dies in the second layer, and the molding material, are planarized to form a surface suitable for direct hybrid bonding to a third layer of dies.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific dimensions, quantities, material types, fabrication steps and the like can be different from those described above in alternative embodiments. The term "coupled" is used herein to express a direct connection as well as a connection through one or more intervening circuits or structures. The terms "example," "embodiment," and "implementation" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

The invention claimed is:

1. A method, comprising:
    obtaining a first die from a first wafer of a first footprint size, the first die being associated with a first layer;
    direct-bonding a second die to the first die, the second die from a second wafer of a second footprint size and being associated with a second layer;
    applying molding material to at least partially fill-in space around the at least one second die;
    creating conductive through-vias, conductive interconnects, or conductive leads in the molding material around the second die to connect the second die to the first die; and
    planarizing a top surface of the second die and the molding material to make a flat surface for subsequent direct-bonding of a third layer.

2. The method of claim 1, further comprising:
    creating at least one layer of silicon or dielectric material to intervene between the first layer and the second layer;
    creating conductive through-vias through the at least one layer of silicon or dielectric material;
    direct hybrid bonding the first layer to a first side of the at least one layer of silicon or dielectric material including to first ends of the conductive through-vias;
    direct hybrid bonding the second layer to a second side of the at least one layer of silicon or dielectric material including to second ends of the conductive through-vias; and
    when the at least one layer of silicon or dielectric comprises multiple layers, then direct bonding the multiple layers to each other, including direct-bonding the through-vias of the multiple layers together to form continuous interconnects from the first layer to the second layer.

3. The method of claim 1, further comprising direct-bonding a third die to the second die; and
    at least partially filling-in space around the third die with molding material.

4. The method of claim 3, wherein the direct-bonding between the at least one second die and the third die comprises direct hybrid bonding of conductive interconnects of the second die and with conductive interconnects of the third layer.

5. The method of claim 3, wherein creating the conductive through-vias, conductive interconnects, or conductive leads connects the second die to the third die or the first die to the third die one of (i) in addition to or (ii) instead of the conductive through-vias, conductive interconnects, or conductive leads connecting the second die to the first die.

6. The method of claim 1, wherein one of the first or second die is an image sensor and the other of the first or second die is a logic die.

7. The method of claim 1, wherein the first die comprises a high bandwidth memory (HBM) die and the second die comprises a logic die.

8. A method, comprising:
    creating conductive through-vias in a carrier wafer;
    conductively bonding a logic die from a first wafer of a first footprint size, to first ends of the through-vias on the carrier wafer;
    conductively bonding a second die from a second wafer of a second footprint size, to second ends of the through-vias of the carrier wafer;
    at least partly filling lateral spaces around the logic die with a molding material; and
    planarizing a top surface of the second die and the molding material to make a flat surface for subsequent direct-bonding of a third layer.

9. The method of claim 8, wherein the logic die on a first side of the carrier and the second die on a second side of the carrier are of different process technologies, different form factors, or different nodes.

10. The method of claim 8, further comprising direct-bonding a third die to the second die; and
    at least partially filling-in space around the third die.

11. The method of claim 10, wherein the direct-bonding between the second die and the third die comprises direct hybrid bonding of conductive interconnects of the second die with conductive interconnects of the third layer.

12. The method of claim 8, wherein the second die comprises an image sensor or a high bandwidth memory (HBM) die.

13. A microelectronic device made by a process, comprising:
- obtaining a first die from a first wafer of a first footprint size;
- direct-bonding a second die to the first die, the second die from a second wafer of a second footprint size;
- applying molding material to at least partially fill-in space around the at least one second die;
- creating a conductive through-via in at least one of the first wafer or the second wafer; and
- planarizing a top surface of the second die and the molding material to make a flat surface for subsequent direct-bonding of a third layer.

14. The microelectronic device made by the process of claim 13, wherein:
- at least one layer of silicon or dielectric material is interposed between a first layer associated with the first die and a second layer associated with the second die;
- the first layer is direct hybrid bonded to a first side of the at least one layer of silicon or dielectric material; and
- the second layer is direct hybrid bonded to a second side of the at least one layer of silicon or dielectric material.

15. The microelectronic device made by the process of claim 14, wherein the conductive through-via connecting at least one of:
- a first layer associated with the first die and a second layer associated with the second die;
- the first layer and a component associated with the second layer;
- the first layer and a conductive interconnect associated with the second die; or
- the first layer and a conductive lead in the molding material surrounding the second die.

* * * * *

UNITED STATES PATENT AND TRADEMARK OFFICE
CERTIFICATE OF CORRECTION

| | |
|---|---|
| PATENT NO. | : 11,276,676 B2 |
| APPLICATION NO. | : 16/413429 |
| DATED | : March 15, 2022 |
| INVENTOR(S) | : Enquist et al. |

It is certified that error appears in the above-identified patent and that said Letters Patent is hereby corrected as shown below:

In the Claims

In Claim 1, Column 17, Line 63, please delete "at least one"

In Claim 4, Column 18, Line 28, please delete "at least one"

In Claim 13, Column 19, Line 11, please delete "at least one"

Signed and Sealed this
Eleventh Day of October, 2022

Katherine Kelly Vidal
*Director of the United States Patent and Trademark Office*